(12) United States Patent
Burchard

(10) Patent No.: US 8,841,156 B2
(45) Date of Patent: Sep. 23, 2014

(54) METHOD FOR THE PRODUCTION OF MICRO-ELECTROMECHANICAL SEMICONDUCTOR COMPONENT

(75) Inventor: Bernd Burchard, Dortmund (DE)

(73) Assignee: ELMOS Semiconductor AG, Dortmund (DE)

( * ) Notice: Subject to any disclaimer, the term of this patent is extended or adjusted under 35 U.S.C. 154(b) by 34 days.

(21) Appl. No.: 13/521,146

(22) PCT Filed: Jan. 10, 2011

(86) PCT No.: PCT/EP2011/050212
§ 371 (c)(1),
(2), (4) Date: Nov. 21, 2012

(87) PCT Pub. No.: WO2011/083161
PCT Pub. Date: Jul. 14, 2011

(65) Prior Publication Data
US 2013/0193529 A1 Aug. 1, 2013

(30) Foreign Application Priority Data

Jan. 11, 2010 (EP) .................................... 10150405

(51) Int. Cl.
*B81C 1/00* (2006.01)
*B81B 3/00* (2006.01)
*G01L 9/00* (2006.01)

(52) U.S. Cl.
CPC ............ *B81C 1/00158* (2013.01); *B81B 3/0021* (2013.01); *G01L 9/0047* (2013.01); *B81C 1/00626* (2013.01); *B81B 2203/0127* (2013.01); *B81B 2201/0235* (2013.01); *B81B 2201/0264* (2013.01); *B81B 3/0018* (2013.01); *B81C 2201/019* (2013.01); *B81B 3/0081* (2013.01)
USPC ............................................... 438/53

(58) Field of Classification Search
CPC .............. B81B 2201/0257; B81B 2201/0235; B81B 2201/0264; B81B 2203/0127; B81B 3/0081; B81B 3/0021; B81B 3/0018; H01R 19/005; H01R 19/04; G01L 9/0042; G01L 9/0073; G01P 15/0802; B81C 1/00158; B81C 1/00626; B81C 2201/019; H01L 21/76898
USPC .................. 257/415, 416, E29.324, E23.141; 438/50, 53, 113, 108
See application file for complete search history.

(56) References Cited

U.S. PATENT DOCUMENTS 4,467,656 A 8/1984 Mallon et al.
5,069,419 A * 12/1991 Jerman ........................... 251/11
(Continued)

OTHER PUBLICATIONS

International Search Report dated Sep. 19, 2011 for corresponding PCT Application No. PCT/EP2011/050212, (5 pgs.).

(Continued)

*Primary Examiner* — Nikolay Yushin
(74) *Attorney, Agent, or Firm* — Shumaker & Sieffert, P.A.

(57) ABSTRACT

The micro-electromechanical semiconductor component is provided with a first semiconductor substrate, which has an upper face, and a second semiconductor substrate, which has an upper face. Both semiconductor substrates are bonded resting on the upper faces thereof. A cavity is introduced into the upper face of at least one of the two semiconductor substrates. The cavity is defined by lateral walls and opposing top and bottom walls, which are formed by the two semiconductor substrates. The top or the bottom wall acts as a reversibly deformable membrane and an opening extending through the respective semiconductor substrate is arranged in the other of said two walls of the cavity.

2 Claims, 44 Drawing Sheets

(56) References Cited

U.S. PATENT DOCUMENTS

Figure 1:
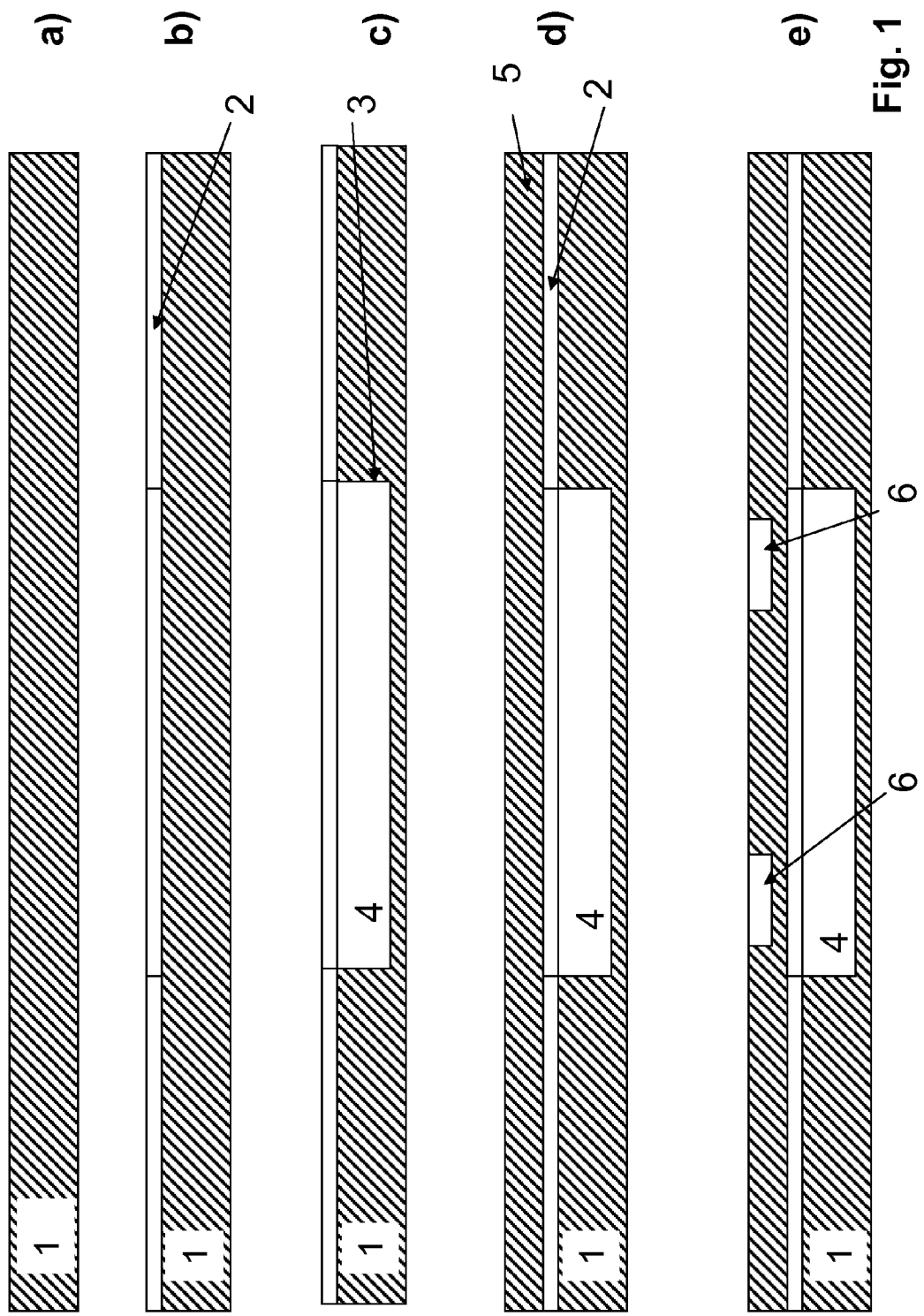

| | | | |
|---|---|---|---|
| 6,006,607 A | 12/1999 | Bryzek et al. | |
| 6,351,996 B1 | 3/2002 | Nasiri et al. | |
| 6,936,491 B2 * | 8/2005 | Partridge et al. | 438/48 |
| 7,111,518 B1 | 9/2006 | Allen et al. | |
| 2007/0023851 A1 | 2/2007 | Hartzell et al. | |
| 2008/0190207 A1 | 8/2008 | Yang | |
| 2010/0052082 A1 * | 3/2010 | Lee et al. | 257/416 |

OTHER PUBLICATIONS

U.S. Appl. No. 13/521,158, filed Jul. 9, 2012, "Micro-Electromechanical Semiconductor Component,".

U.S. Appl. No. 13/521,168, filed Jul. 9, 2012, "Micro-Electromechanical Semiconductor Component,".

Written Opinion dated Sep. 19, 2011 for corresponding PCT Application No. PCT/EP2011/050212, (6 pgs.).

* cited by examiner

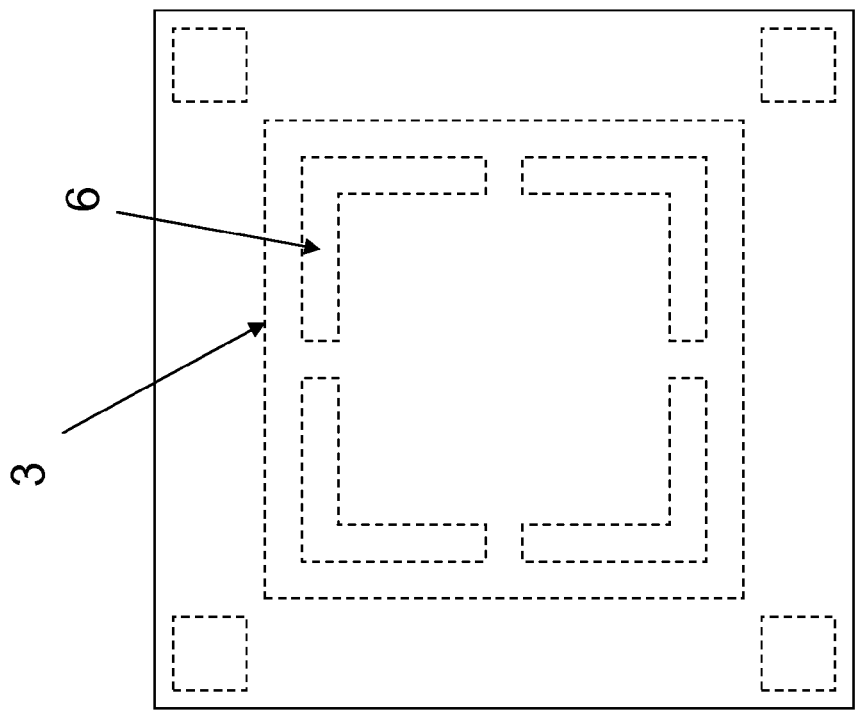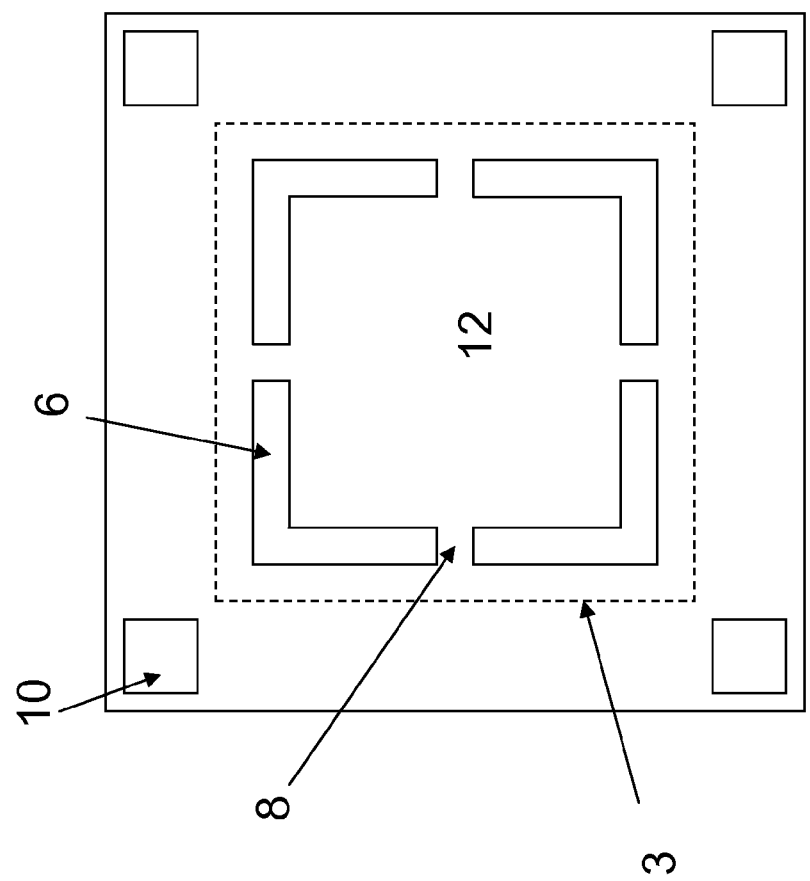
Fig. 20

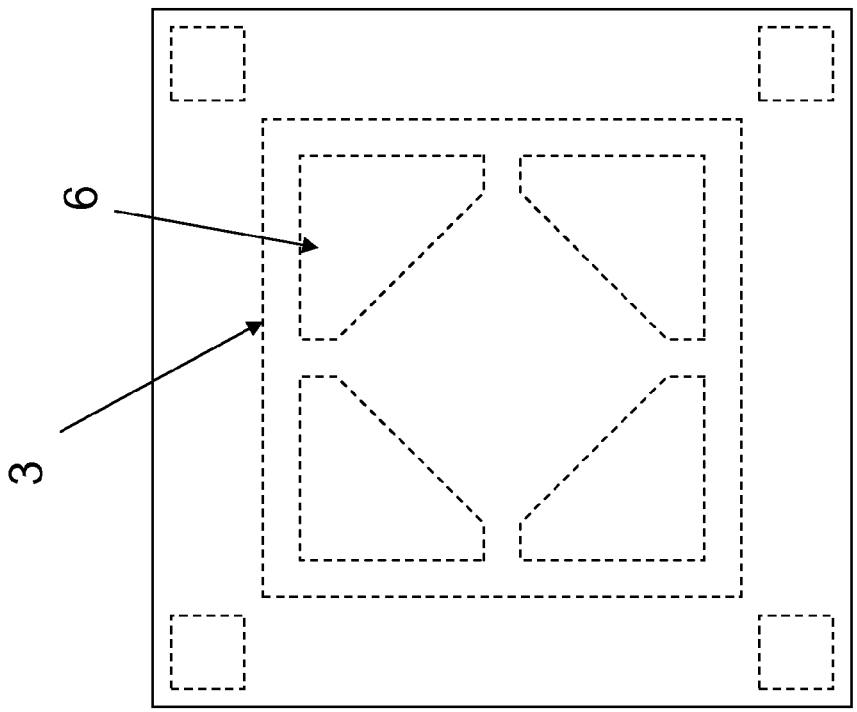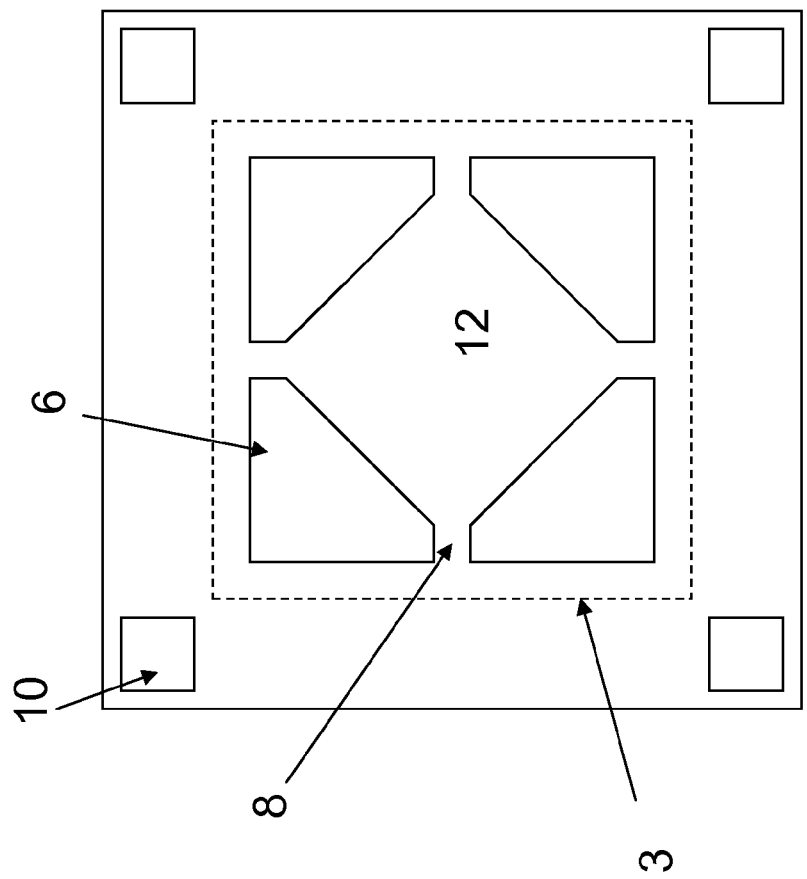
Fig. 21

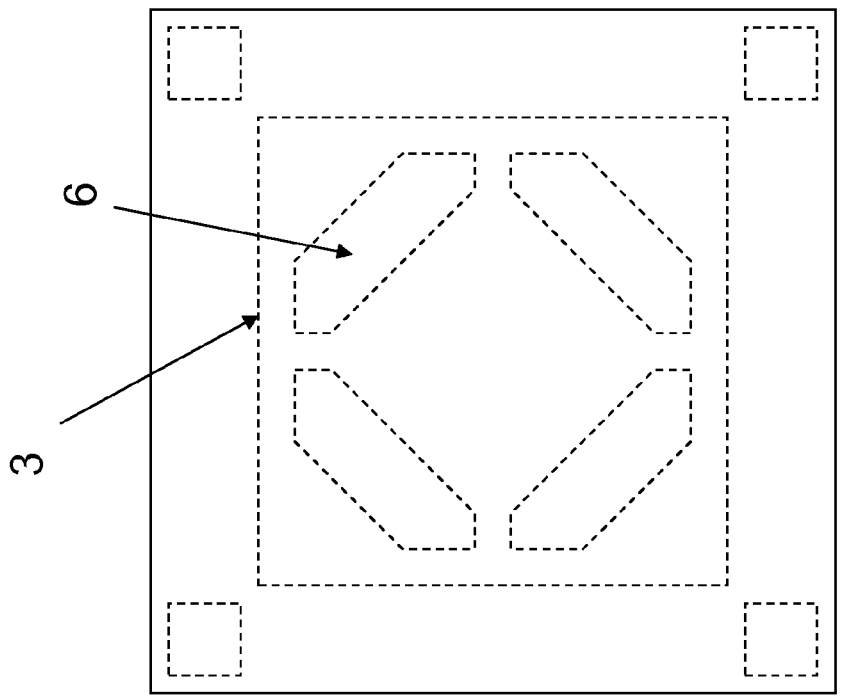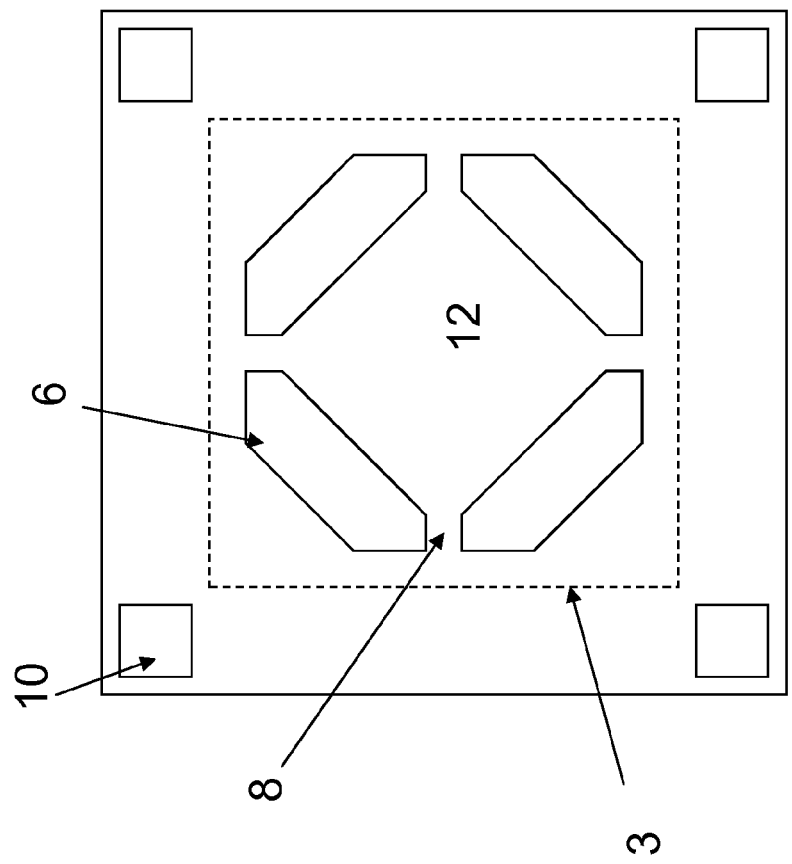
Fig. 22

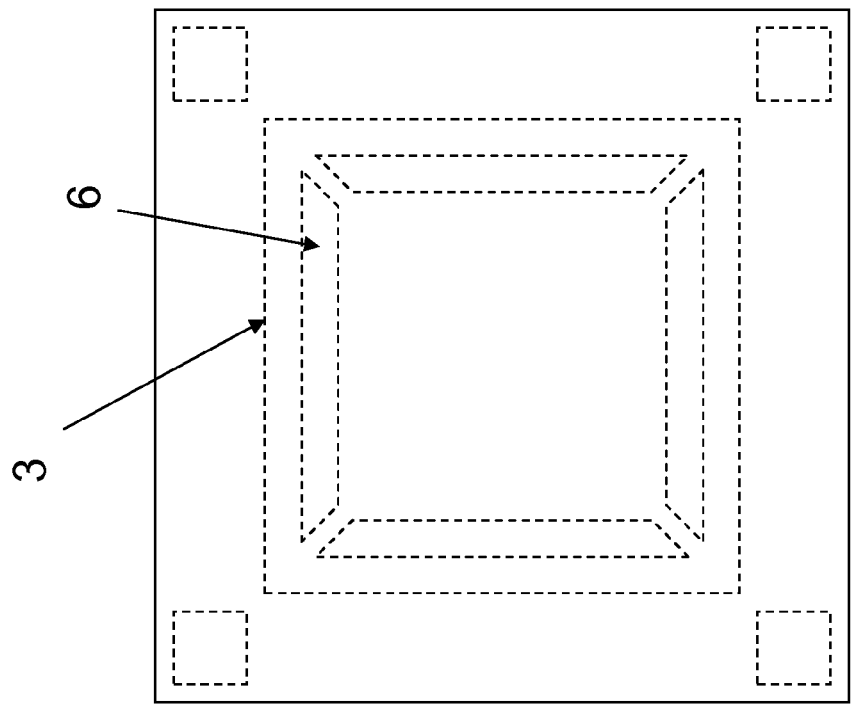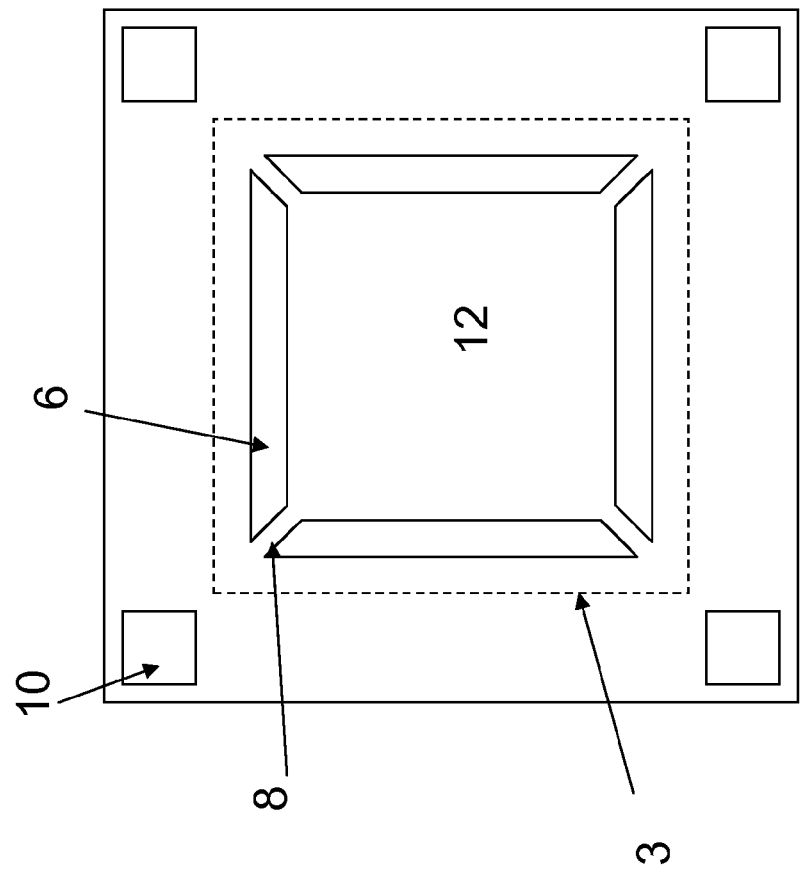
Fig. 23

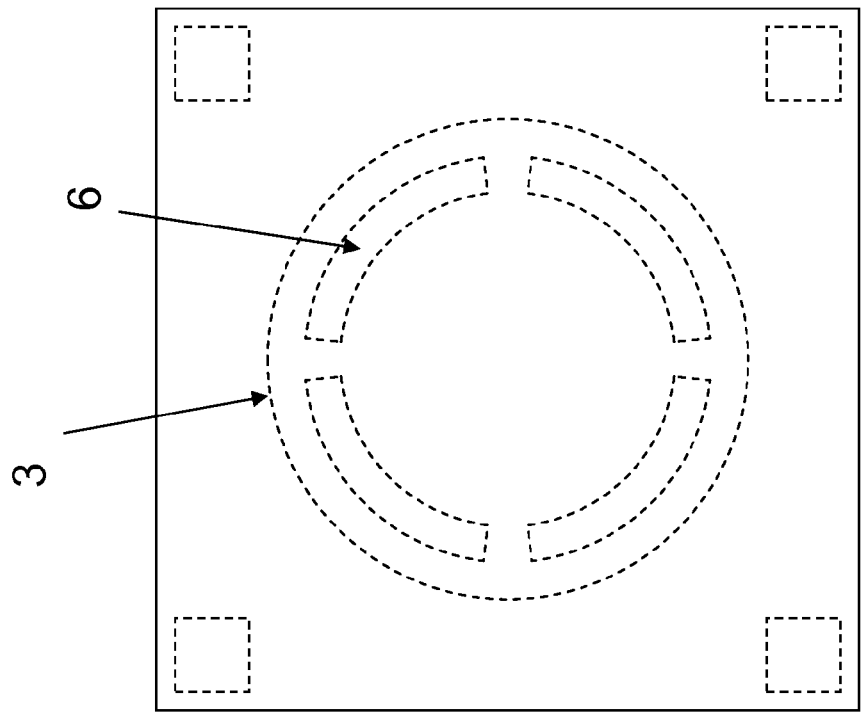
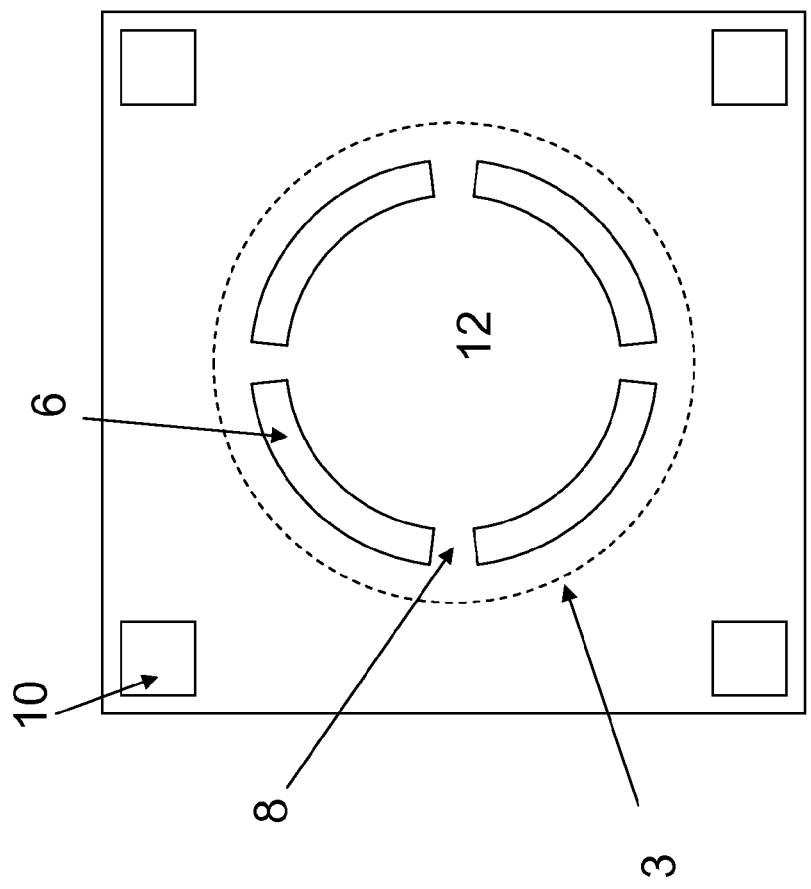
Fig. 24

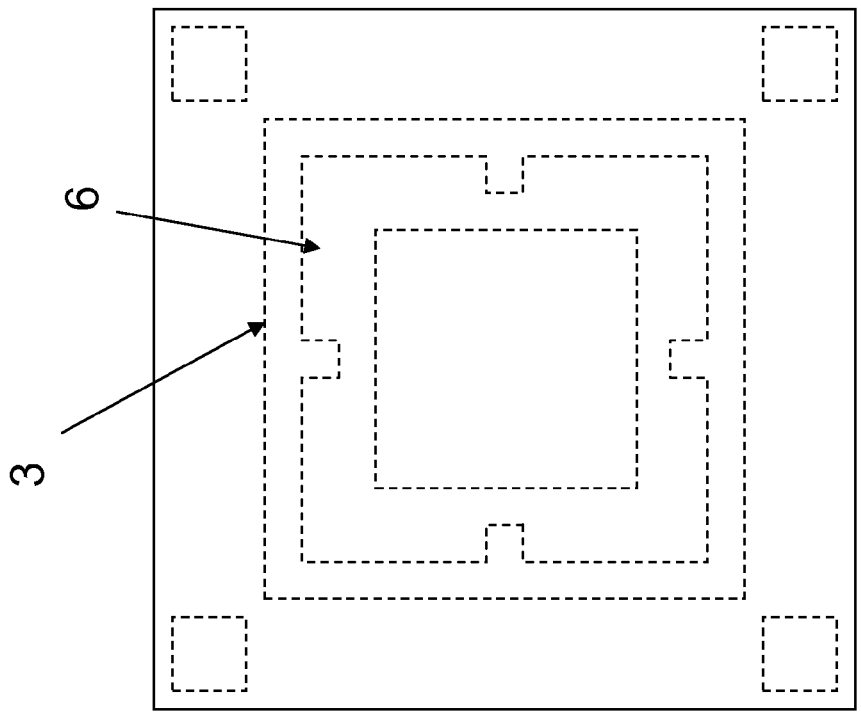
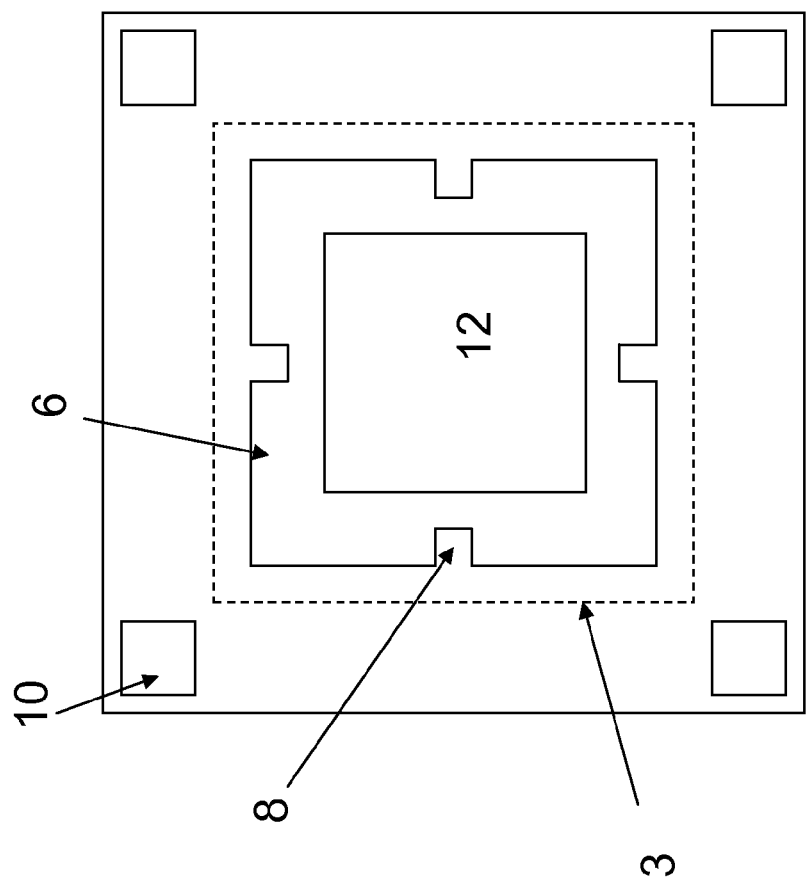
Fig. 25

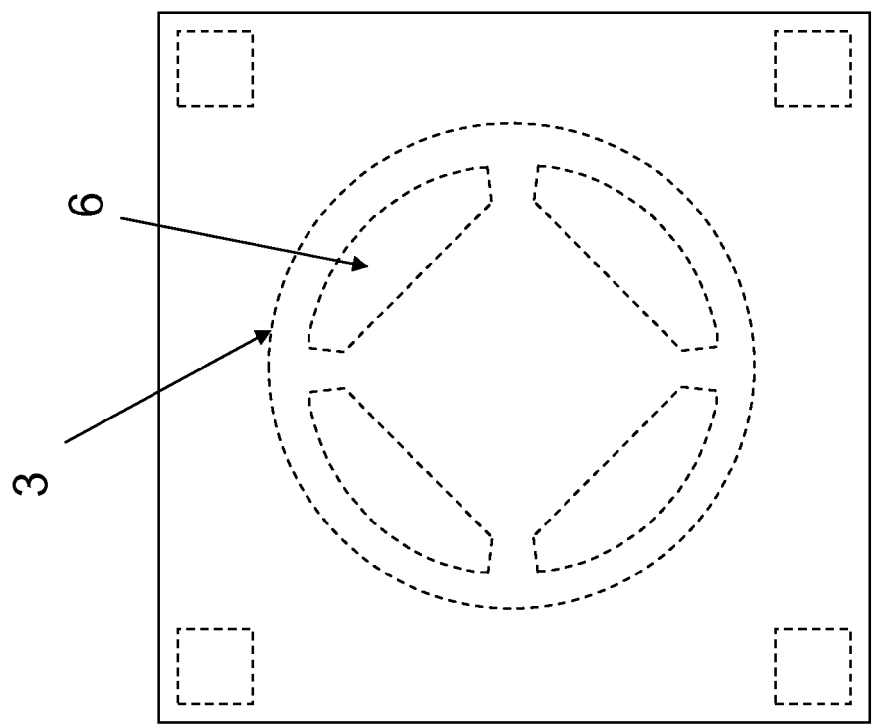
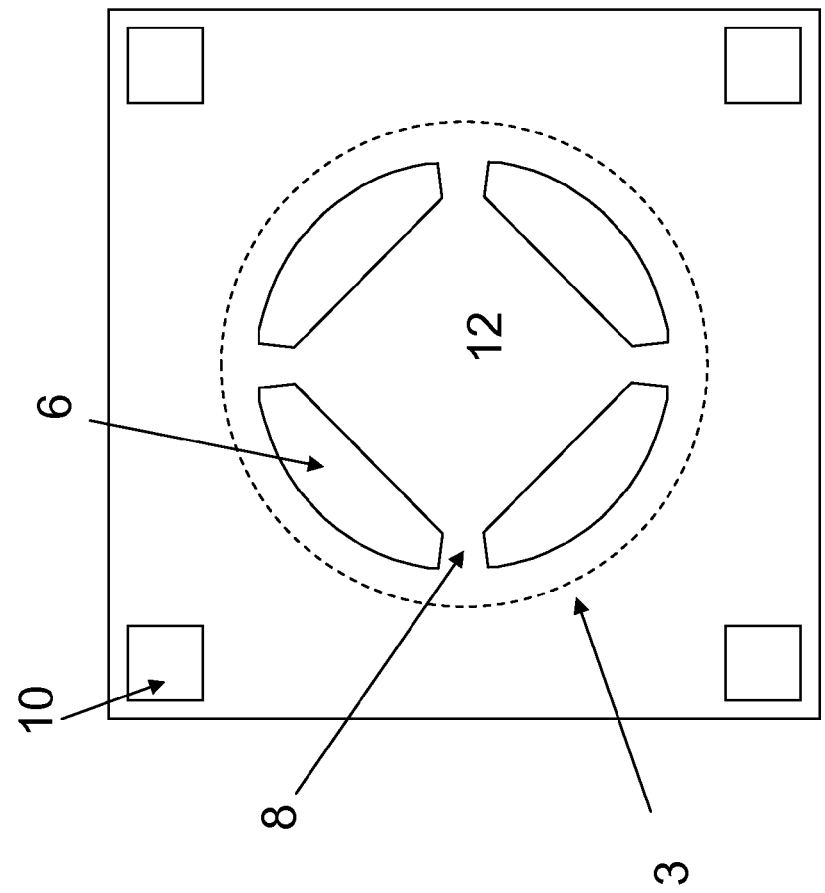
Fig. 31

METHOD FOR THE PRODUCTION OF MICRO-ELECTROMECHANICAL SEMICONDUCTOR COMPONENT

The invention relates to a micro-electromechanical semiconductor component and a method for producing the same. Particularly, the invention relates to a micromechanical component being compatible with regard to usual semiconductor component manufacturing processes and having a low power consumption, and particularly a micromechanical CMOS sensor having a reversibly deformable membrane for receiving pressure forces and other forces.

The design of micro-electromechanical and respectively micromechanical components made of semiconductor material for application as pressure and respectively acceleration sensors is basically known. These micro-electromechanical semiconductor components comprise a cavity which is covered by a reversibly deformable membrane. Herein, one mostly uses two semiconductor substrates (the so-called handle wafer and the so-called device wafer) which are mutually bonded on top of each other. In at least one of the two semiconductor substrates, a cavity has been formed beforehand by an etching process, said cavity being then covered by the other semiconductor substrate. The cavity is also referred to as a "buried cavity".

In the above described manner, absolute pressure sensors can be produced in a quite reliable manner.

It is an object of the invention to produce differential pressure sensors by use of the buried cavity technology.

For achieving the above object, there is proposed, according to the invention, a micro-electromechanical semiconductor component comprising
  a first semiconductor substrate having an upper face,
  a second semiconductor substrate having an upper face,
  both semiconductor substrates being bonded resting on the upper faces thereof,
  a cavity being introduced into the upper face of at least one of the two semiconductor substrates, and
  said cavity being defined by lateral walls and opposing top and bottom walls which are formed by the two semiconductor substrates, and
  the top or the bottom wall acting as a reversibly deformable membrane, and an opening extending through the respective semiconductor substrate being arranged in the other of said two walls of the cavity.

For achieving the above object, there further serves a method for producing a micro-electromechanical semiconductor component, comprising the following steps:
  providing a first semiconductor substrate having an upper face,
  providing a second semiconductor substrate having an upper face,
  forming a cavity in the upper face of at least one of the two semiconductor substrates,
  bonding the two semiconductor substrates resting on each other by their upper faces,
  etching, into one of the two semiconductor substrates, an opening entering said cavity.

A method for producing a micro-electromechanical semiconductor component, comprising the following steps:
  providing a first semiconductor substrate (1) having an upper face,
  providing a second semiconductor substrate (5) having an upper face,
  forming a cavity (4) in the upper face of at least one of the two semiconductor substrates (1,5),
  bonding the two semiconductor substrates (1,5) resting on each other by their upper faces,
  etching, into one of the two semiconductor substrates (1,5), an opening (98) entering said cavity (4).

The invention thus provides a micro-electromechanical semiconductor component which can be used as a differential pressure sensor, wherein, for producing this sensor, use is made of the known and well-proven buried cavity technology. Up to now, for producing micro-electromechanical differential pressure sensors, their cavities and membranes were etched free from the rear side. In the micro-electromechanical semiconductor component of the invention, by generating an etched opening which enters the cavity, the semiconductor material delimiting the cavity will be maintained; into this semiconductor material, there will instead be etched only the small-sized opening which is situated in the otherwise completely maintained bottom wall of the cavity arranged opposite to the membrane. Thus, the micro-electromechanical semiconductor component of the invention has an increased robustness against housing and assembly stress. The torsional stiffness of the micro-electromechanical semiconductor component of the invention is guaranteed, as in the design of absolute pressure sensors, by the buried cavity technology through the mutually bonded semiconductor substrates; nonetheless, the micro-electromechanical semiconductor component of the invention can be used as a differential pressure sensor.

Suitably, the cavity is generated by forming it only in one of the two semiconductor substrates, the other semiconductor substrate then serving, after bonding, for covering and closing the cavity. In this arrangement, the cavity is defined by surrounding side walls formed in one or both semiconductor substrates, and by opposing top and bottom walls. One of the two latter walls acts as reversibly deformable membrane while the etched opening is formed in the other wall which is arranged opposite to this membrane. The opening will be suitably generated in the last method step by a wet or dry chemical process. Prior to that, e.g. by a common component production process (e.g. CMOS process), electric and/or electronic components have been produced in at least one of the two semiconductor substrates. Further, at this prior time, if required, the membrane has been at least partially be reduced in thickness, which has been performed e.g. by trenches formed in the membrane by etching or by similar depressions serving for thinning the material.

The invention will be explained in greater detail hereunder with reference to the drawing. Specifically, the drawings show the following:

FIG. 1 Process for producing a structure in accordance with the invention:
  a) raw wafer
  b) oxidation and opening of windows
  c) etching the cavity
  d) bonding the top wafer (followed by the CMOS process, which is not especially shown)
  e) etching the trenches (after the CMOS process).

Figure 2:
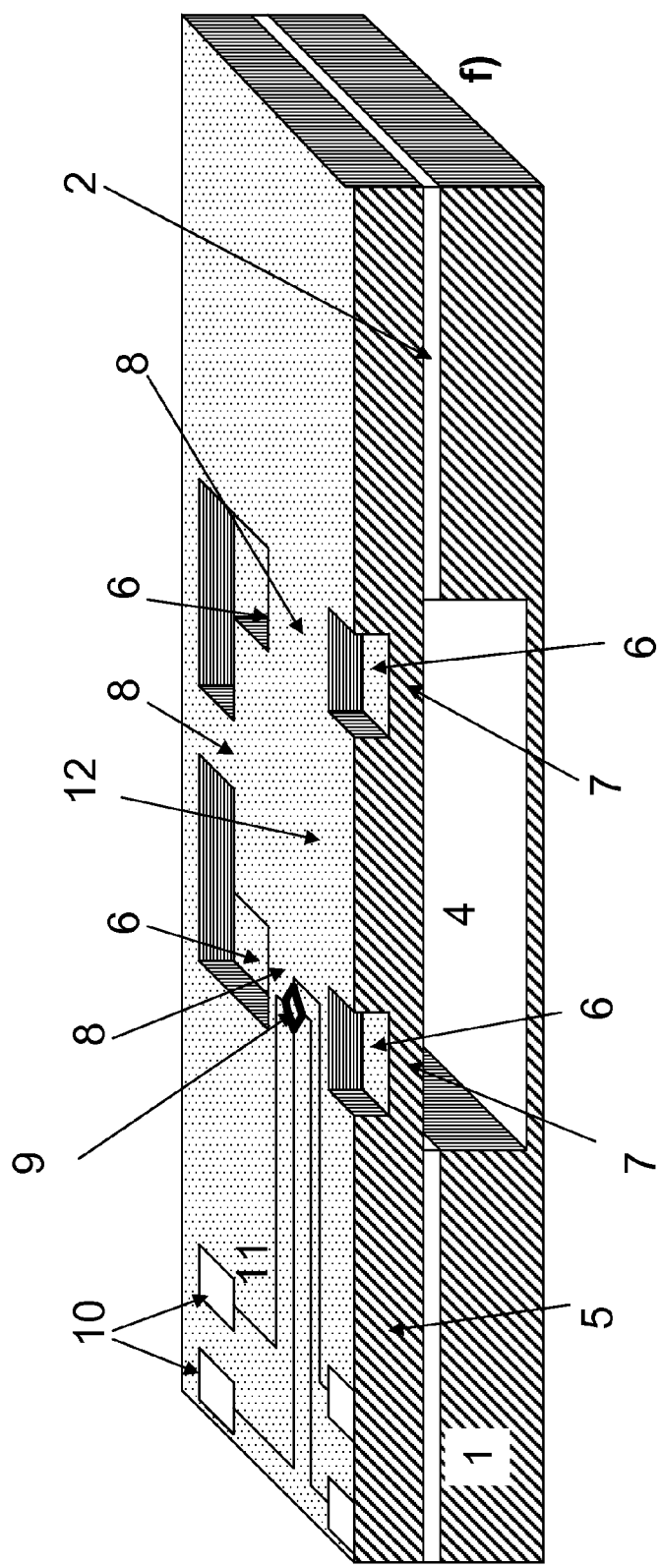

FIG. 2 Three-dimensional simplified sectional view of a pressure sensor produced according to the process of FIG. 1.

Figure 3:
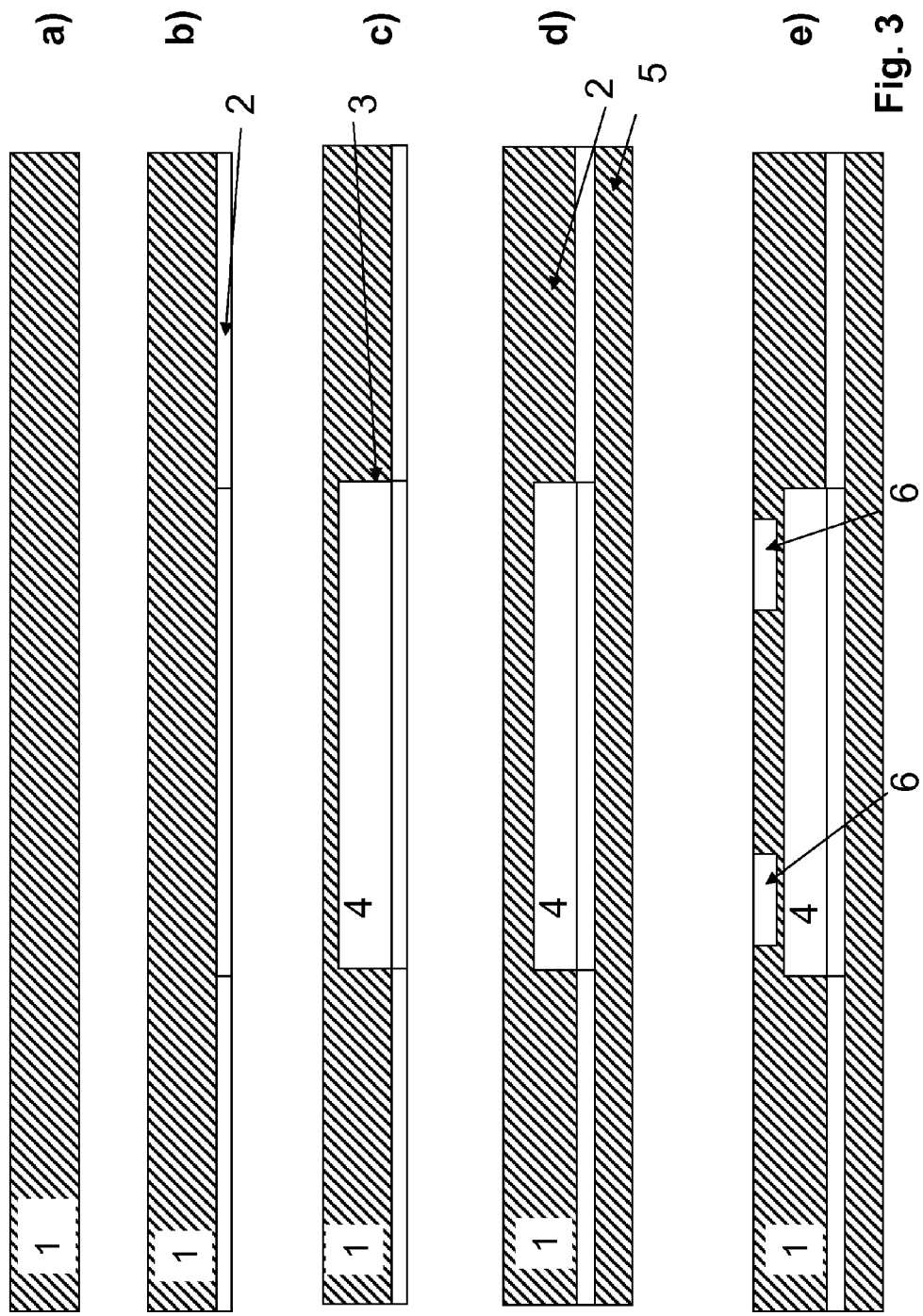

FIG. 3 Alternative second process for producing a structure in accordance with the invention:
  a) raw wafer
  b) oxidation and opening of windows
  c) etching the cavity
  d) bonding the handle wafer (followed by the CMOS process on the top wafer with cavity, which is not especially shown)
  e) etching the trenches (after the CMOS process).

Figure 4:
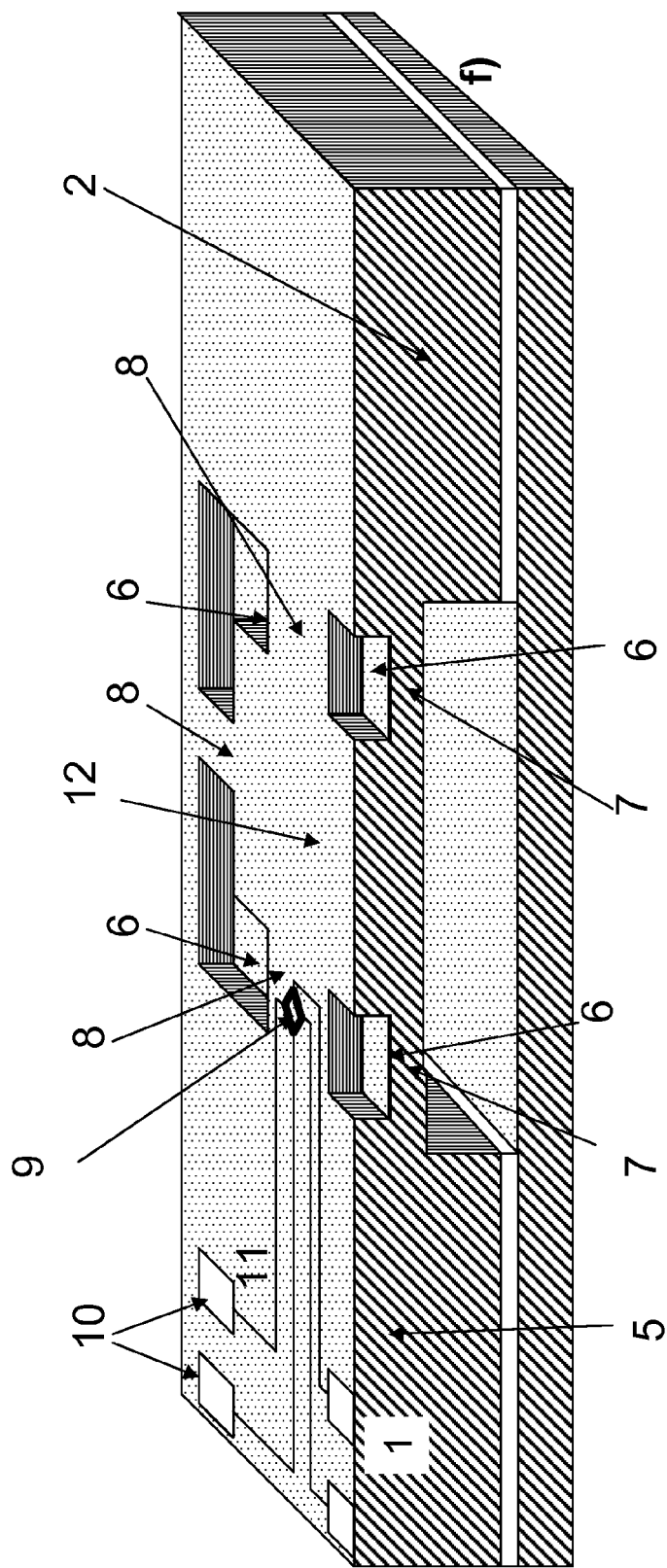
Figure 5:
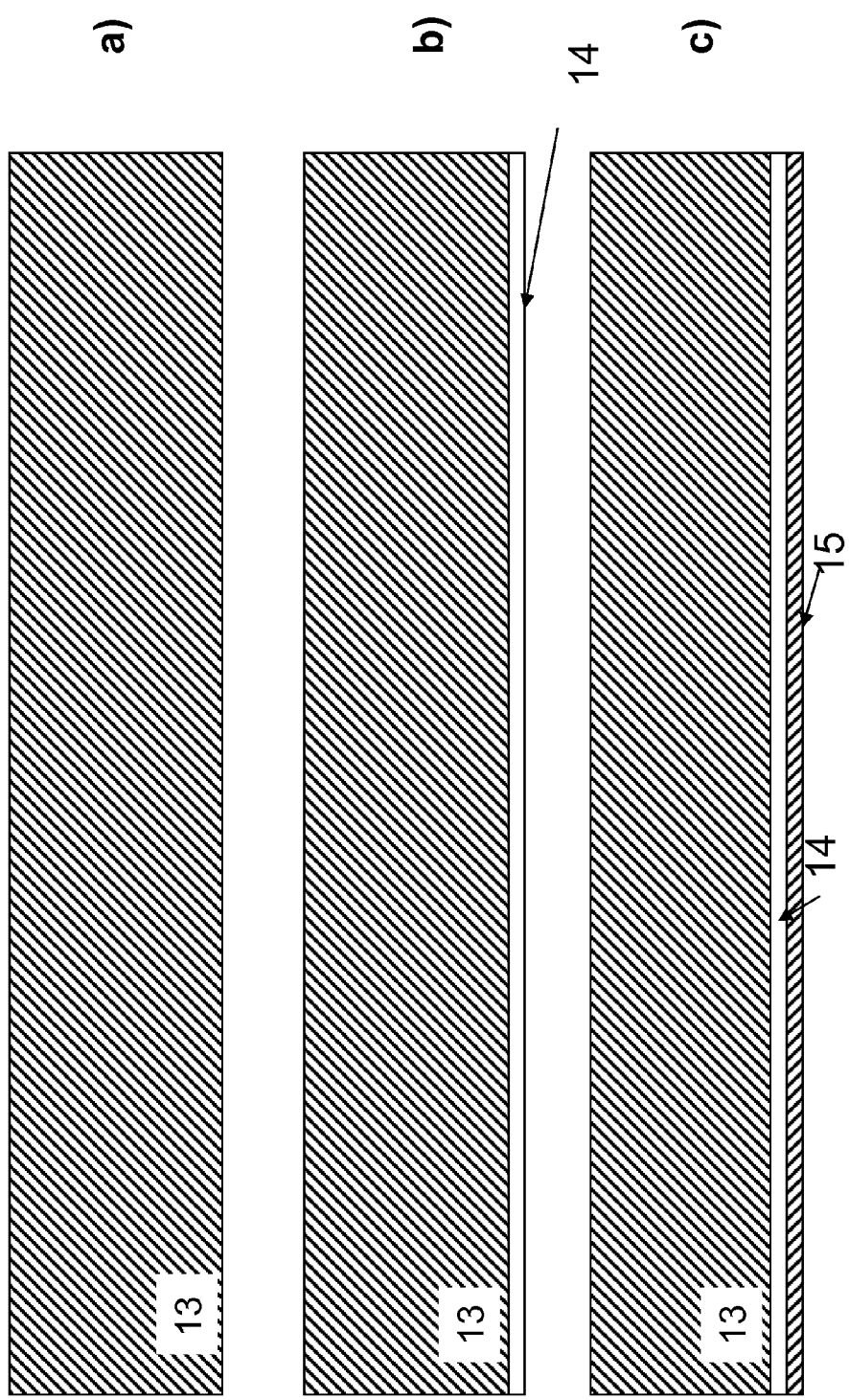
Figure 6:
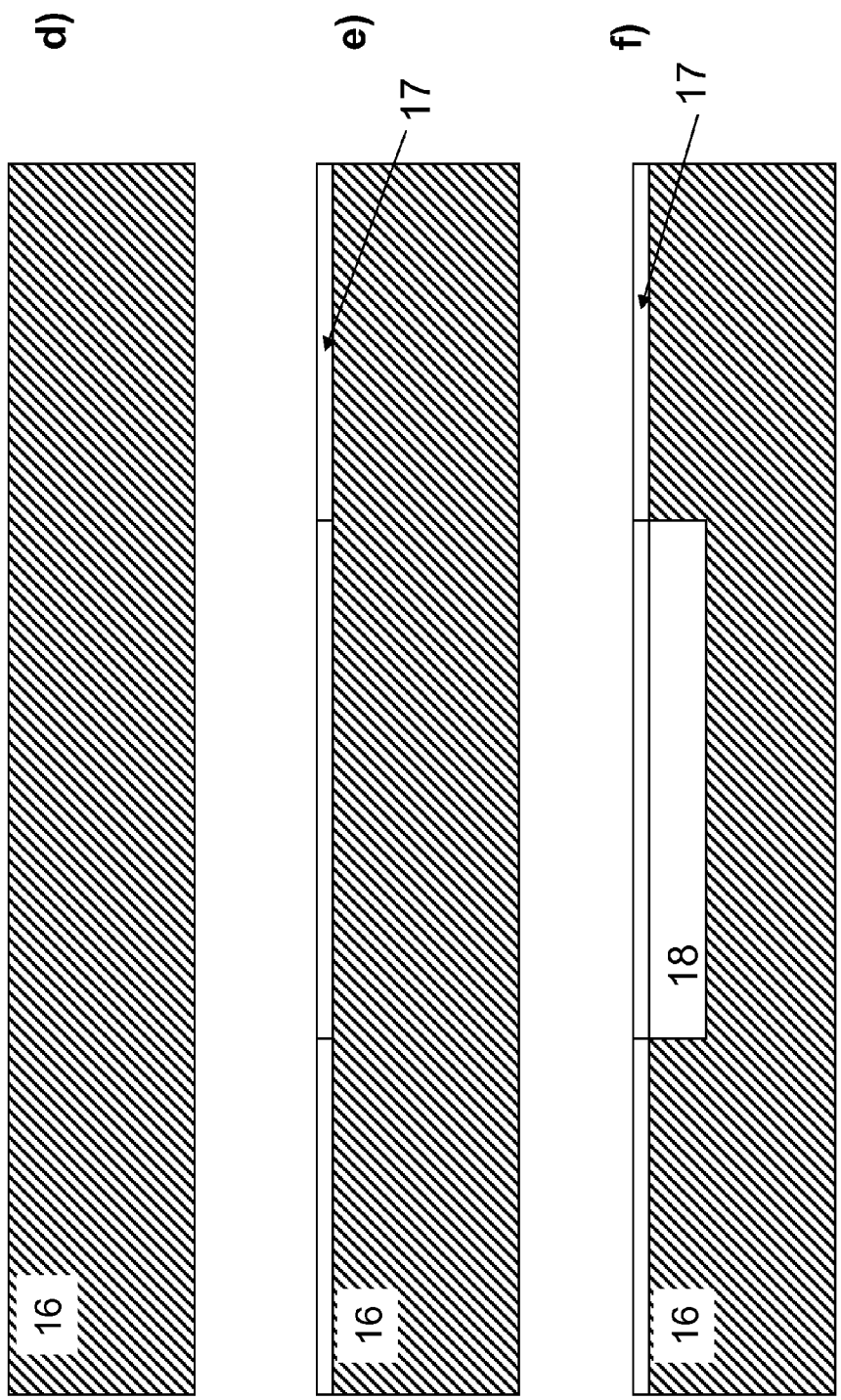
Figure 7:
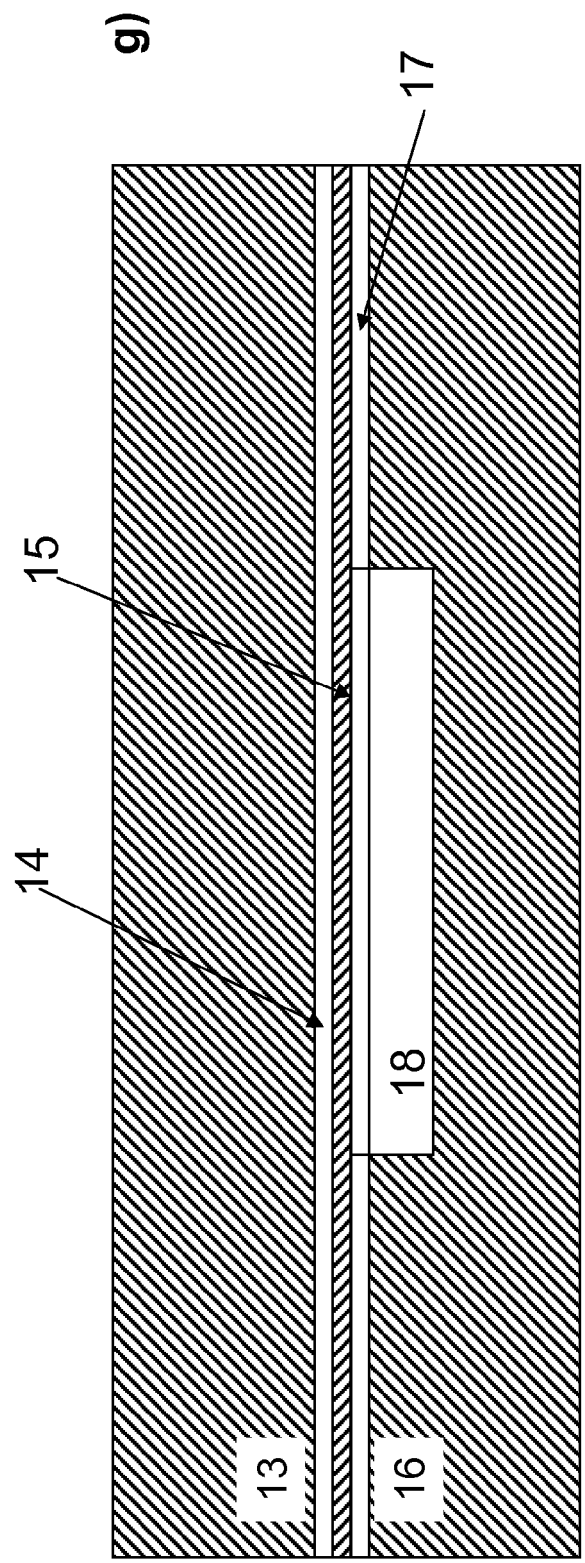

FIG. 4 Three-dimensional simplified sectional view of a pressure sensor produced according to the process of FIG. 3.

FIGS. 5 to 10

Alternative third process for producing a structure in accordance with the invention:
a) raw wafer
b) oxidation
c) application of polysilicon layer and partial oxidation
d) second raw wafer
e) oxidation and opening of a window
f) etching the cavity
g) bonding the handle wafer
h) partial grinding (followed by the CMOS process on the top wafer with cavity, which is not especially shown)
i) etching the trenches (after the CMOS process)
j) three-dimensional simplified sectional view of a pressure sensor produced according to the process of FIGS. 5 to 9.

Figure 11:
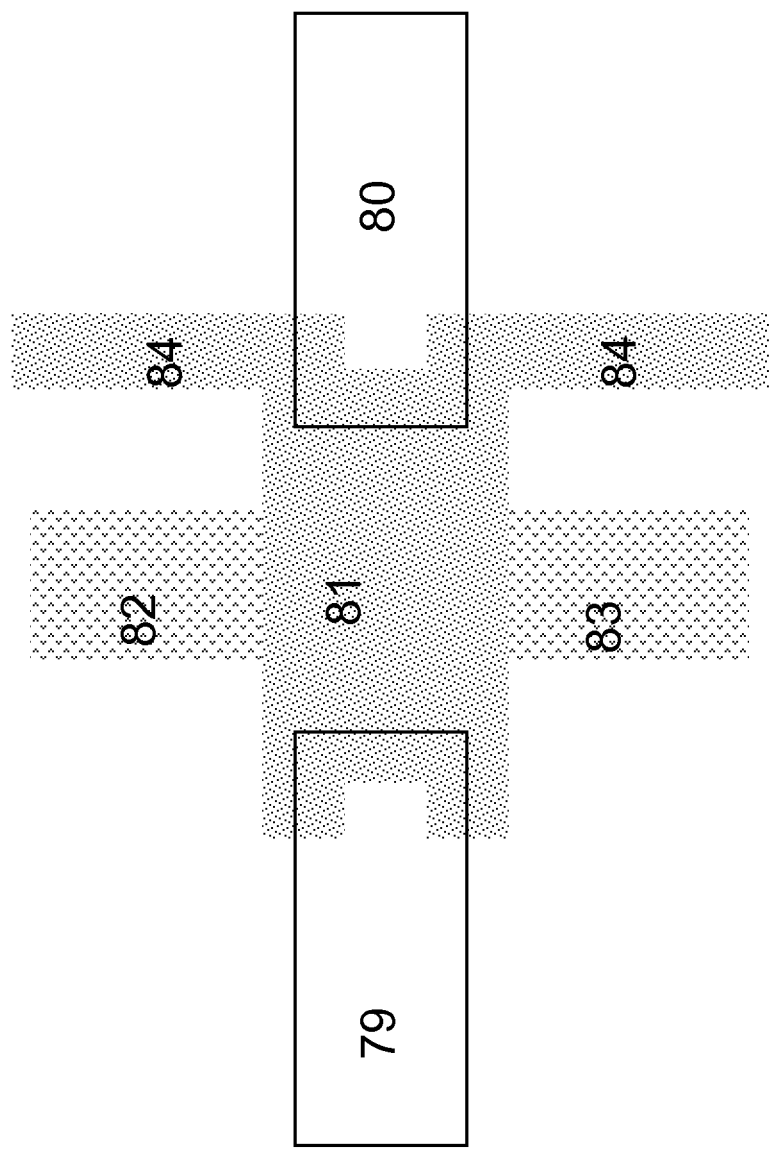

FIG. 11 Example of the layout of a transistor.

Figure 12:
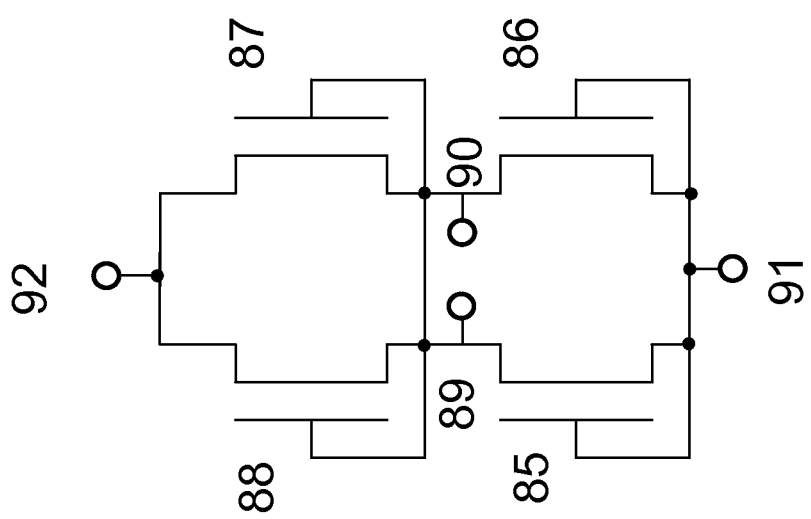

FIG. 12 Connection of four transistors to form a Wheatstone bridge (operation of the transistors as resistors).

Figure 13:
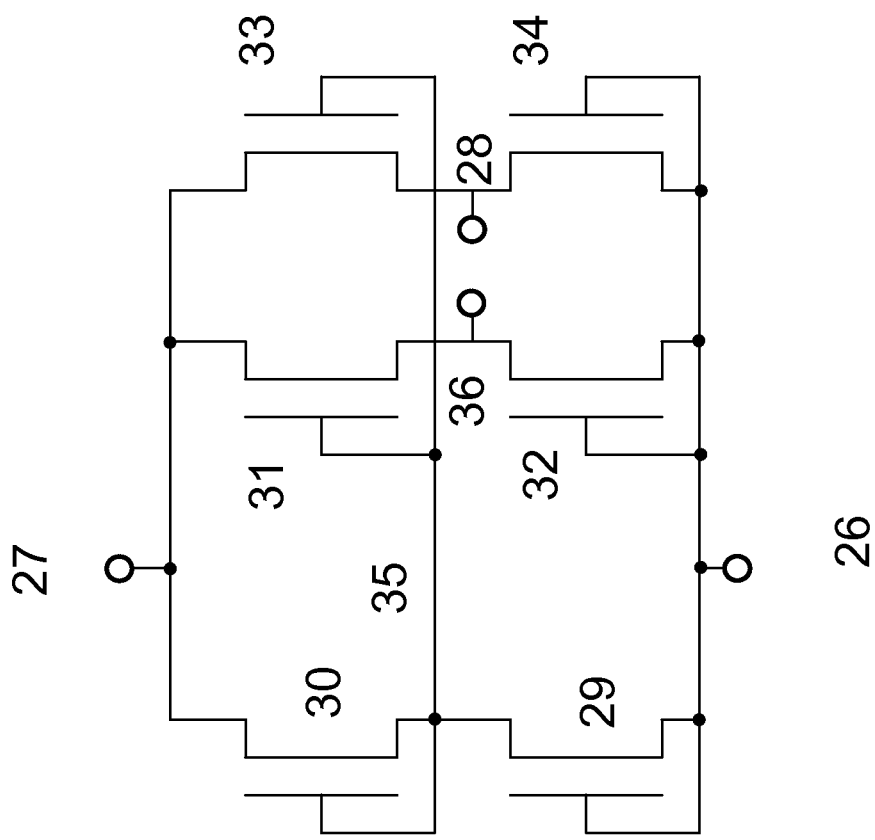

FIG. 13 Exemplary connection of four transistors and two further transistors to form a Wheatstone bridge with reference voltage source.

Figure 14:
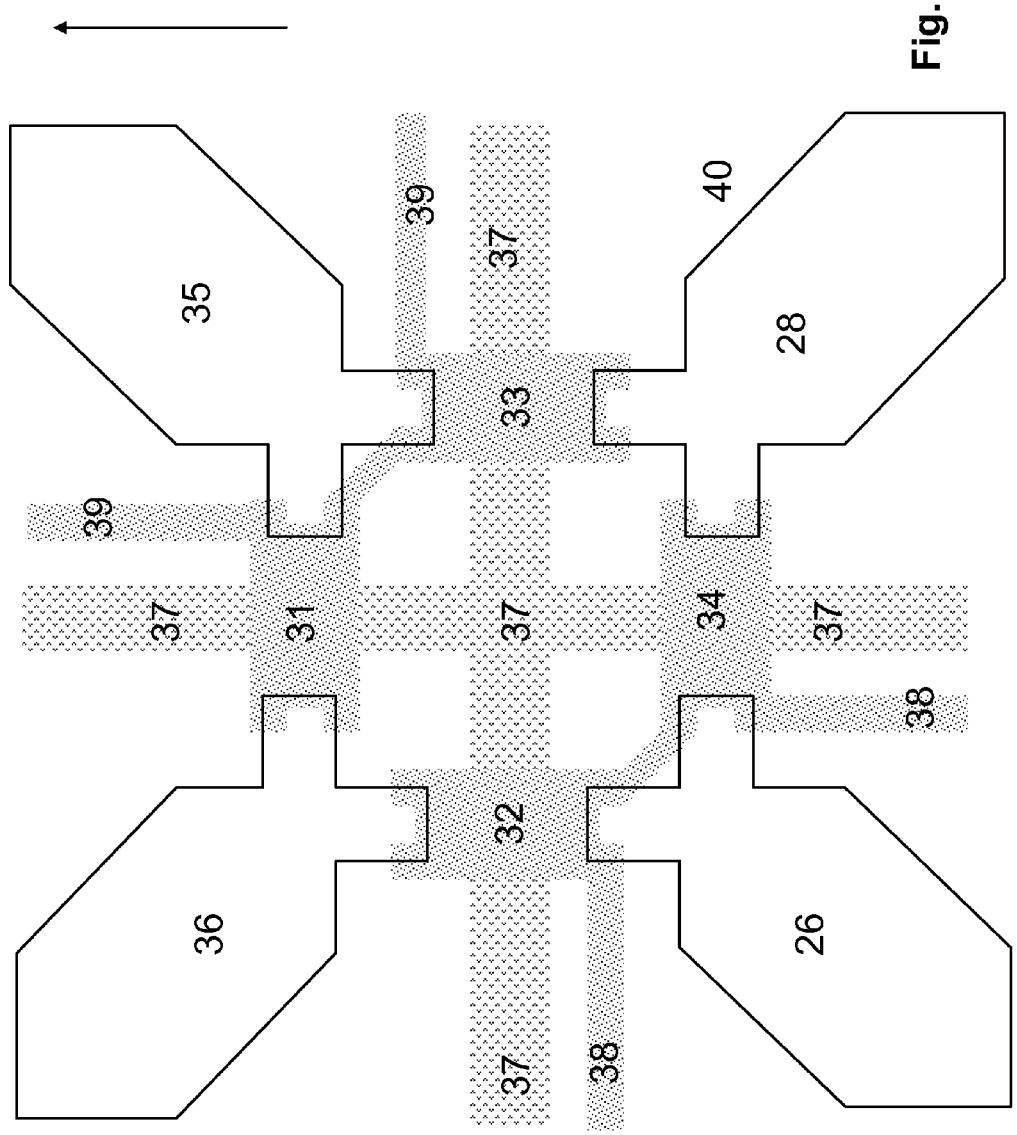

FIG. 14 Exemplary layout of a Wheatstone bridge.

Figure 15:
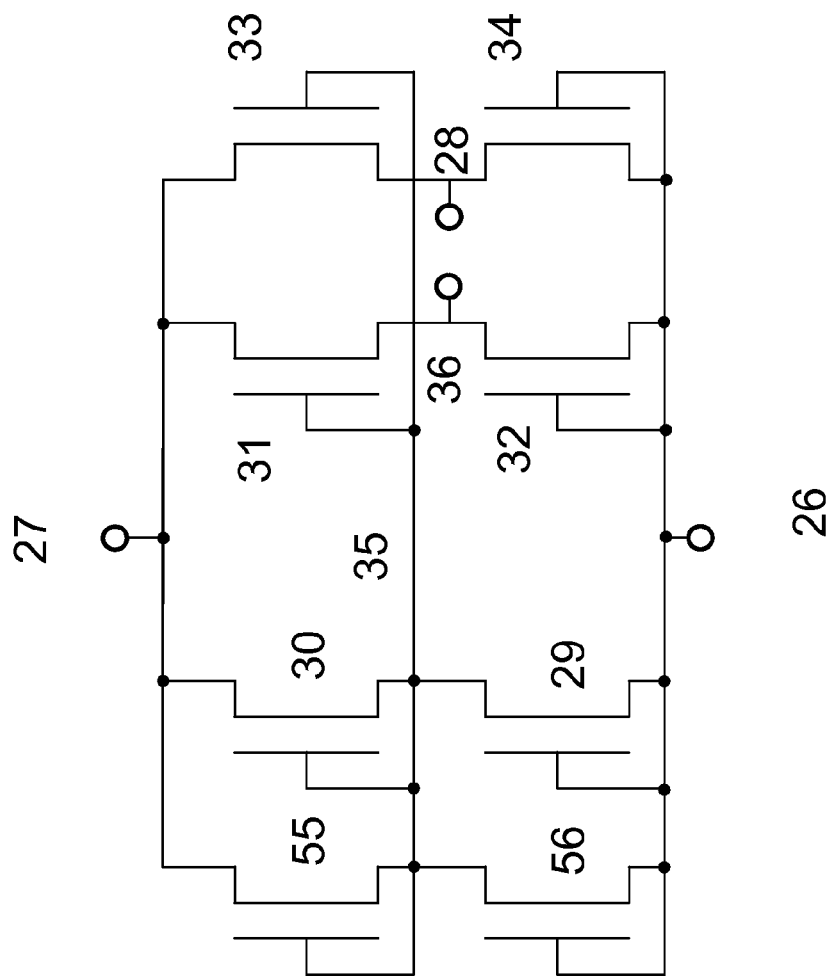

FIG. 15 Connection of eight transistors to form a Wheatstone bridge, with a second short-circuited Wheatstone bridge as a reference voltage source.

Figure 16:
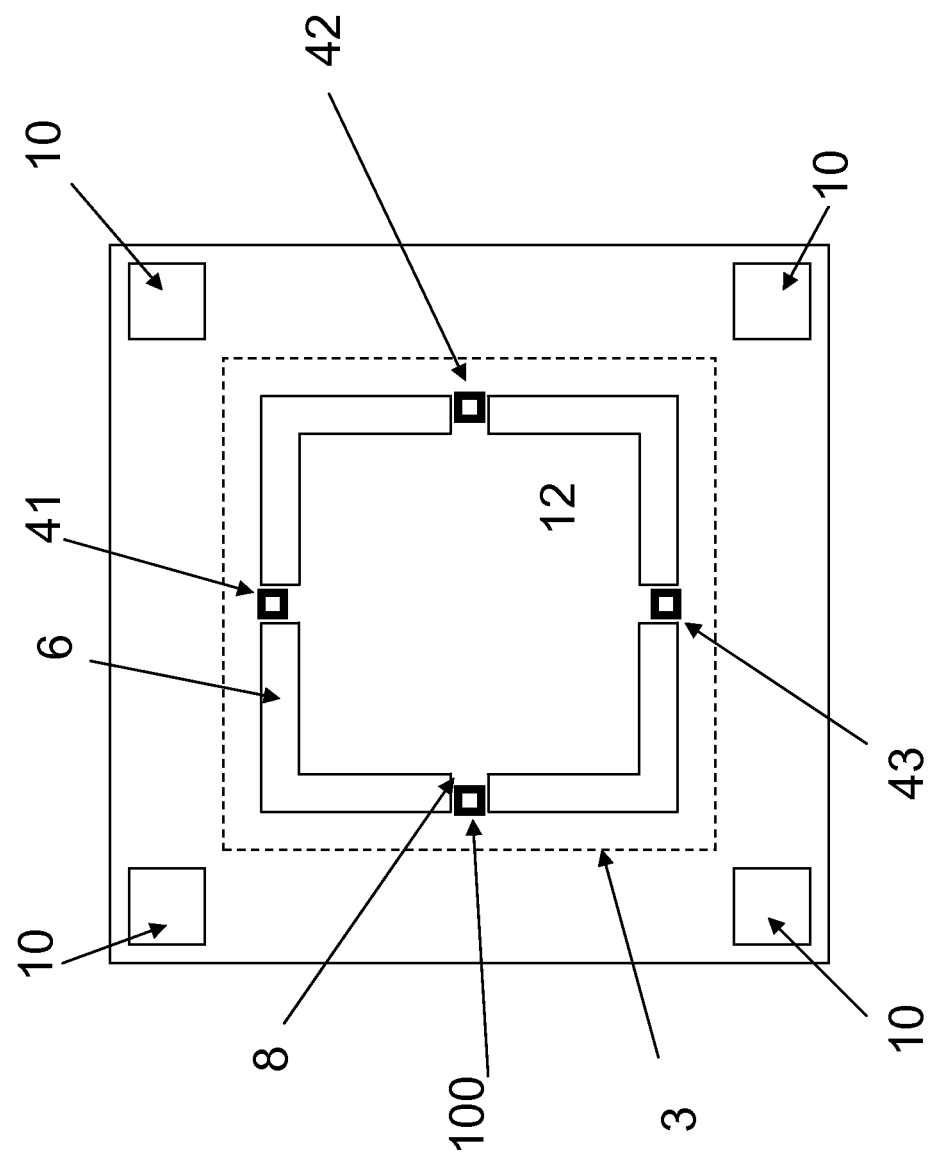

FIG. 16 Example of a placement of four Wheatstone bridges according to FIG. 12 on a sensor die with trench structure.

Figure 17:
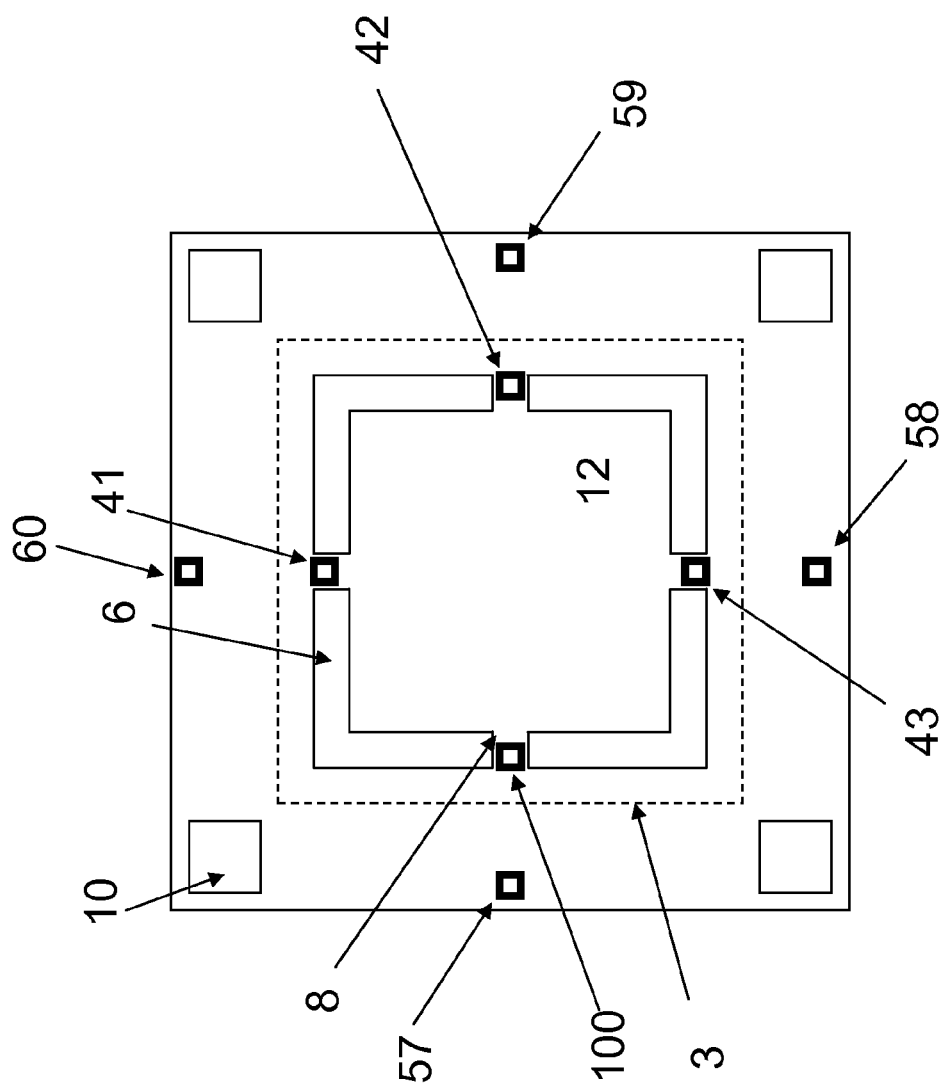

FIG. 17 Example of a placement of four Wheatstone bridges with four Wheatstone bridges as stress-free references according to FIG. 15 on a sensor die with trench structure (For better survey, the voltage references are not illustrated. In principle, for each pair of Wheatstone bridges, there will suffice a third, short-circuited Wheatstone bridge besides the stress-free reference bridge. Thus, 12 Wheatstone bridges would be found on the die).

Figure 18:
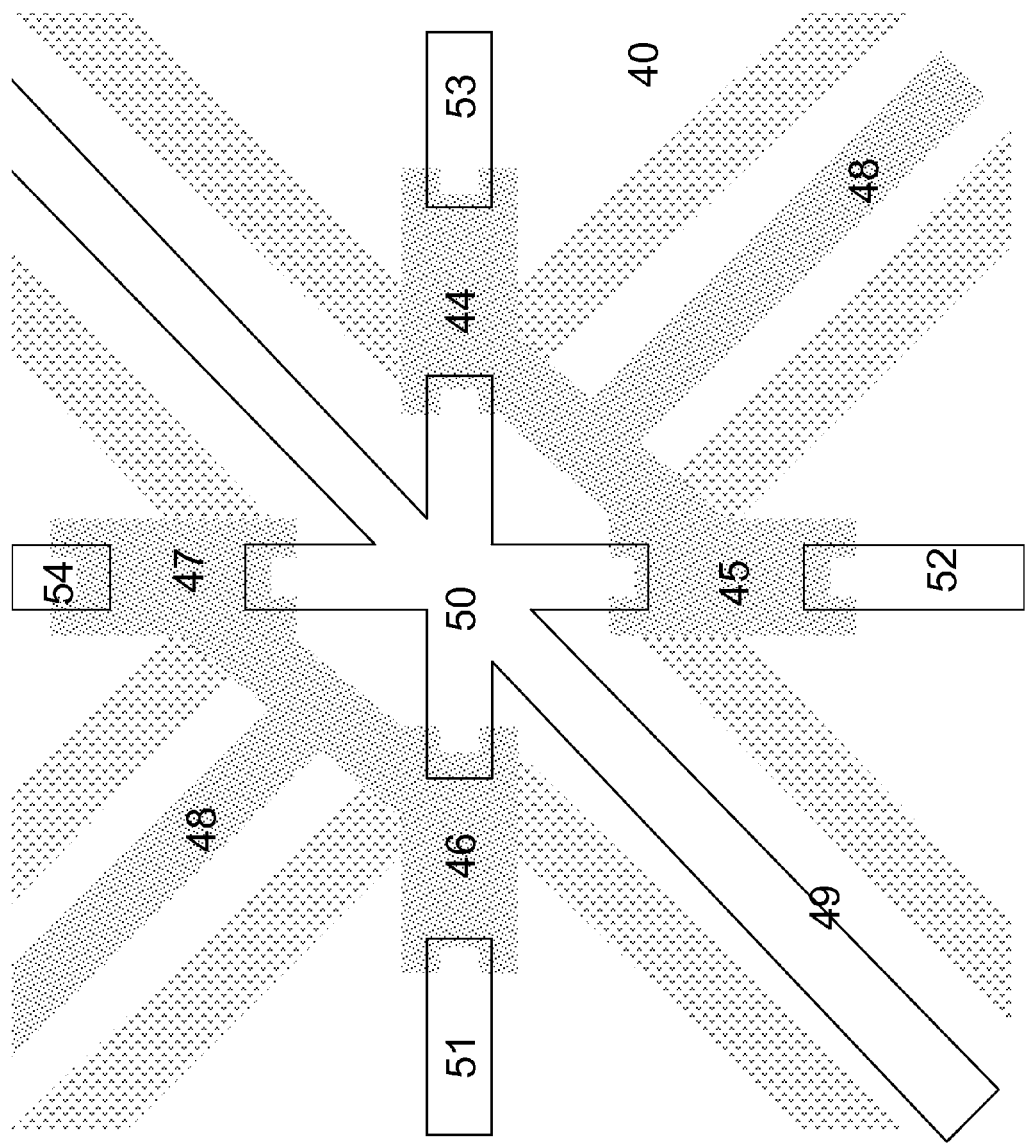

FIG. 18 Exemplary layout of a differential stage.

Figure 19:
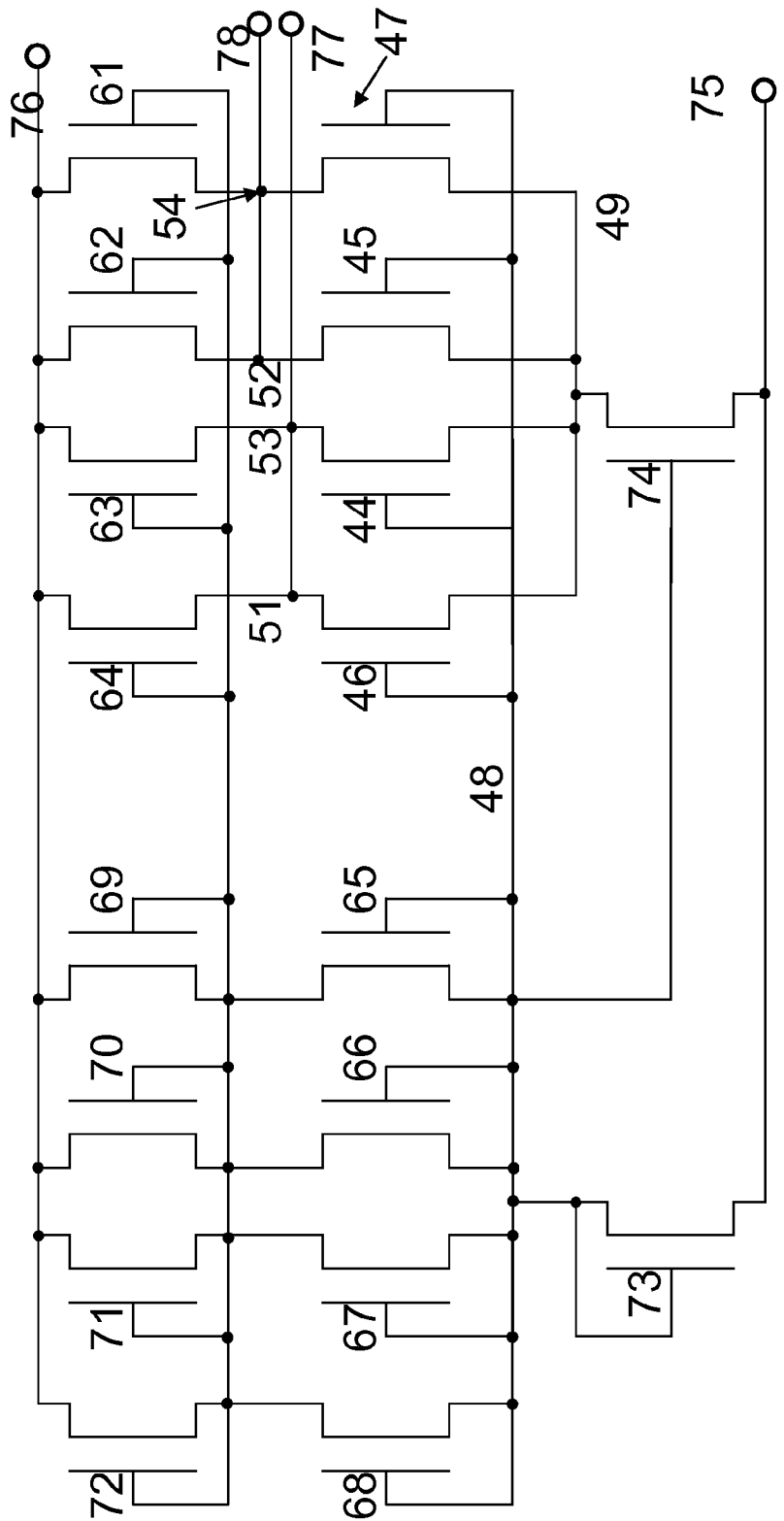

FIG. 19 Exemplary circuit arrangement for a circuit with a differential amplifier and a referential differential amplifier as a reference voltage source.

FIG. 20 View onto an exemplary membrane geometry with quadratic trench system
a) plan view
b) view from below.

FIG. 21 View onto an exemplary membrane geometry with quadratic trench system and rhombic central portion
a) plan view
b) view from below.

FIG. 22 View onto an exemplary membrane geometry with quadratic trench system which was chamfered in the corners, and with rhombic central portion
a) plan view
b) view from below.

FIG. 23 View onto an exemplary membrane geometry with quadratic trench system and webs in the corners,
a) plan view
b) view from below.

FIG. 24 View onto an exemplary membrane geometry with round trench system and round cavity,
a) plan view
b) view from below.

FIG. 25 View onto an exemplary membrane geometry with round trench system and non-continuous webs,
a) plan view
b) view from below.

Figure 26:
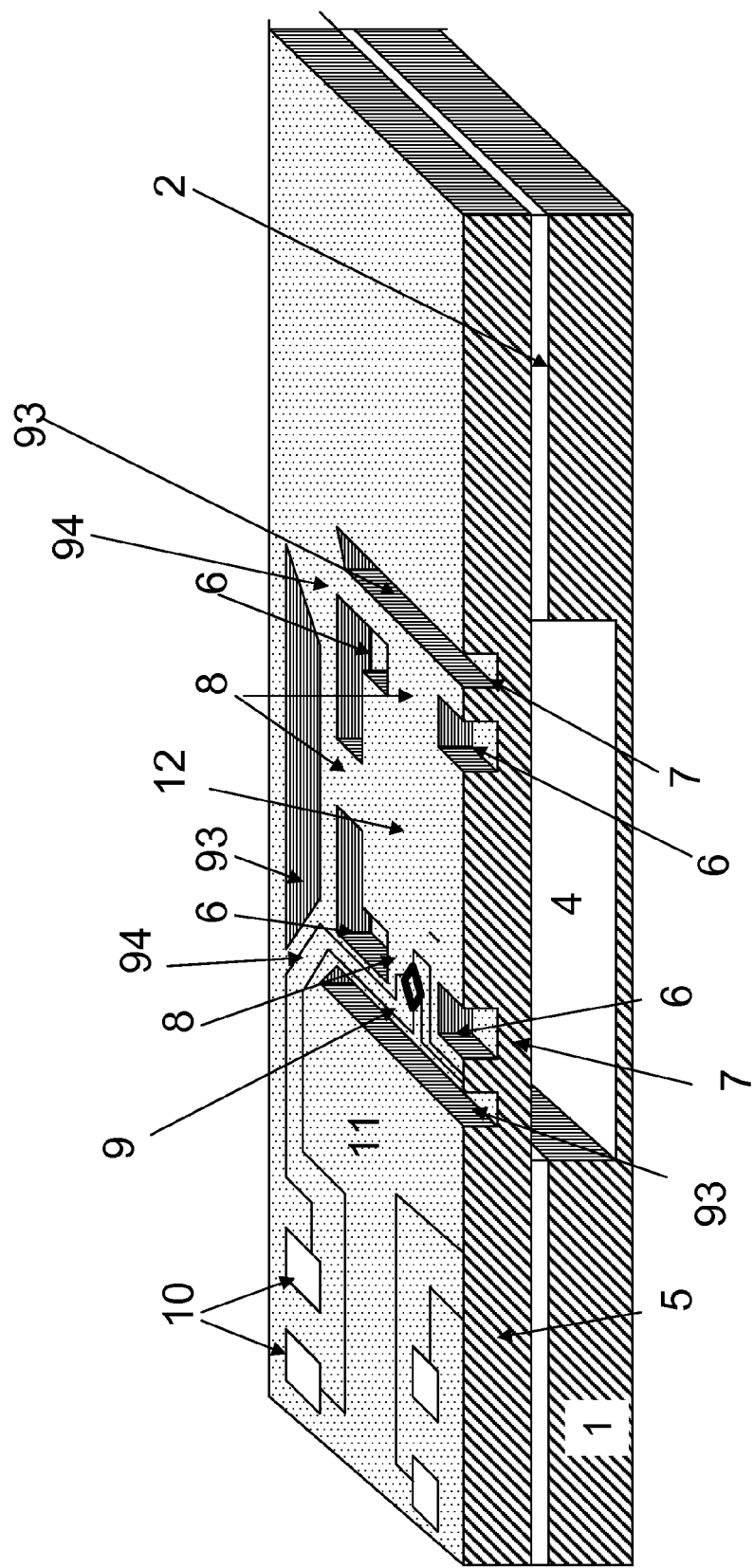
Figure 27:
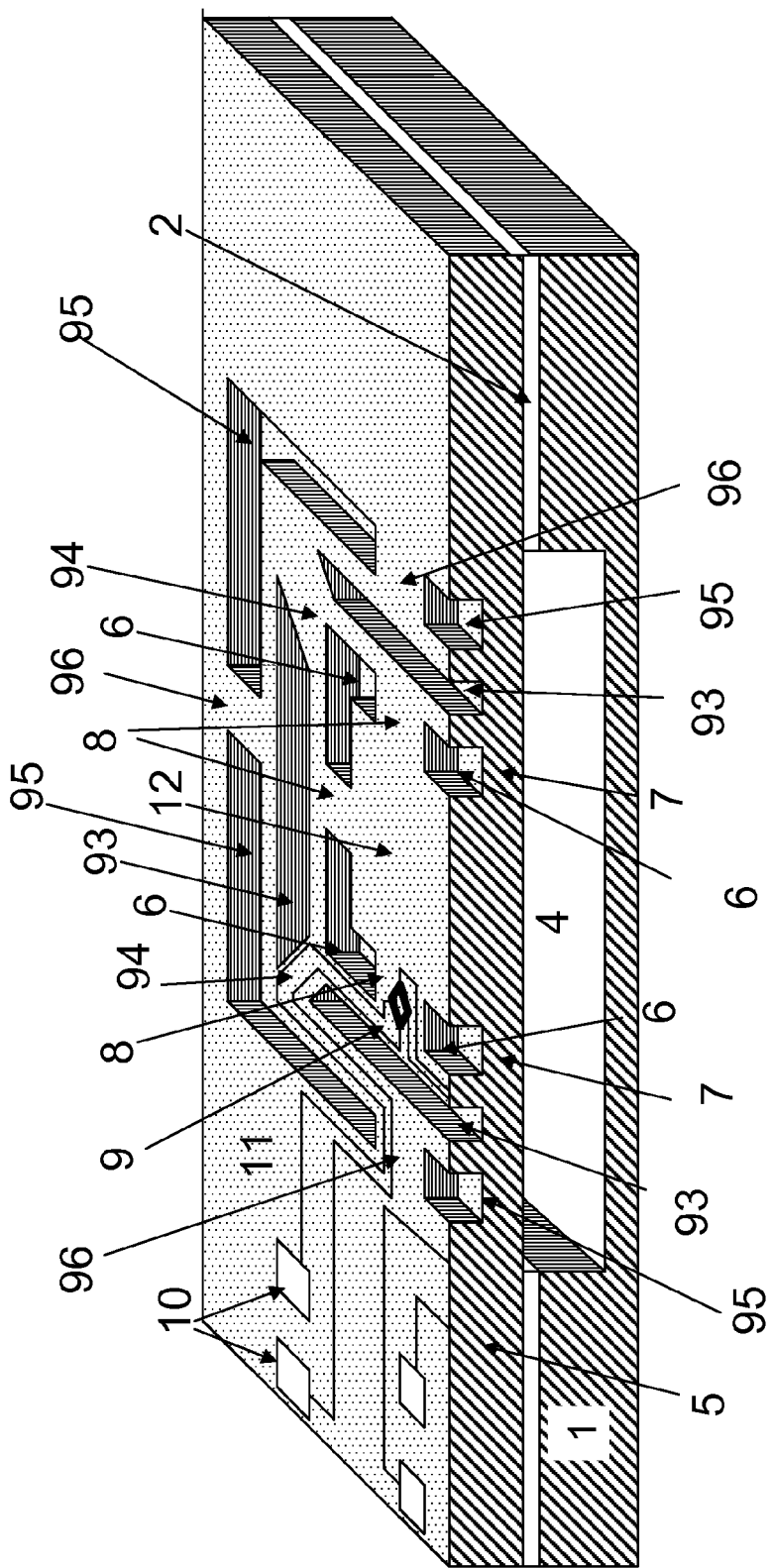

FIGS. 26 and 27
sensors with additional trenches.

Figure 28:
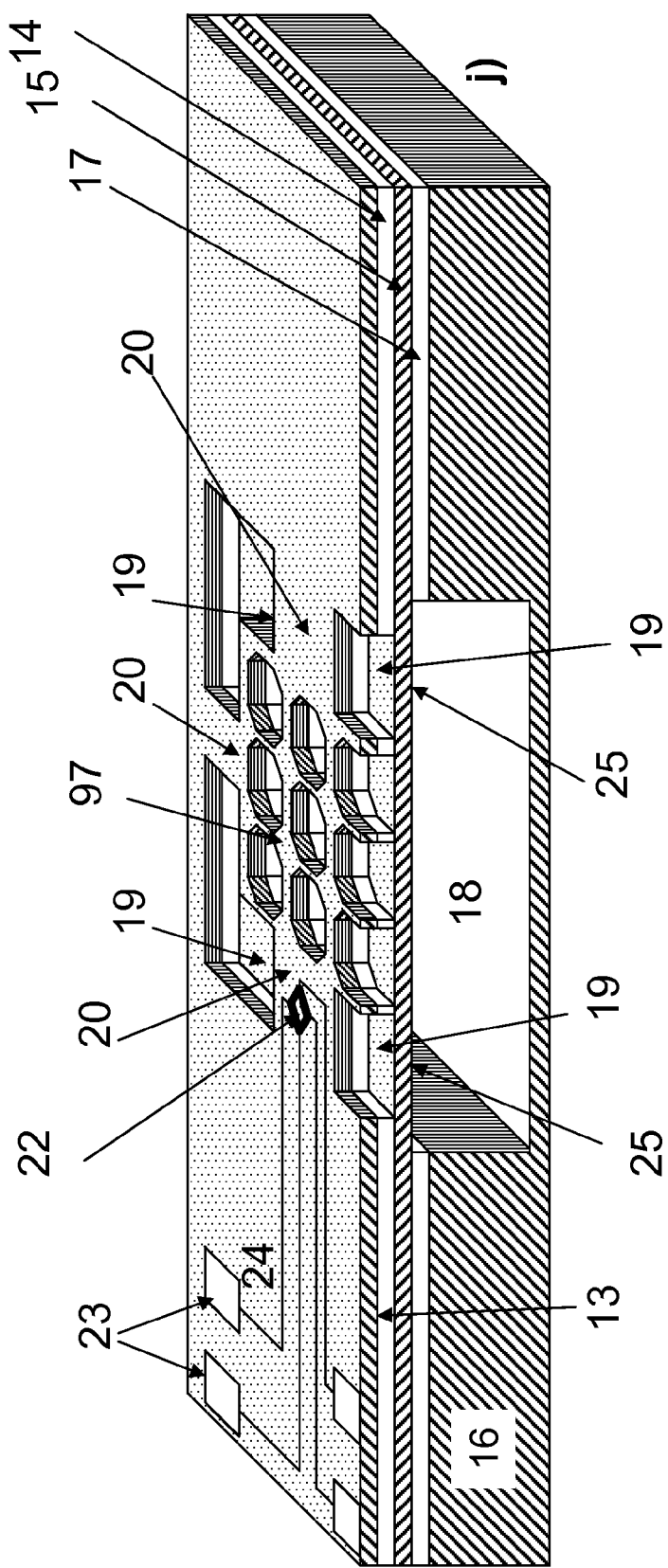

FIG. 28 Boss (central membrane reinforcement) with mass reduction by etched support structure 97.

Figure 29:
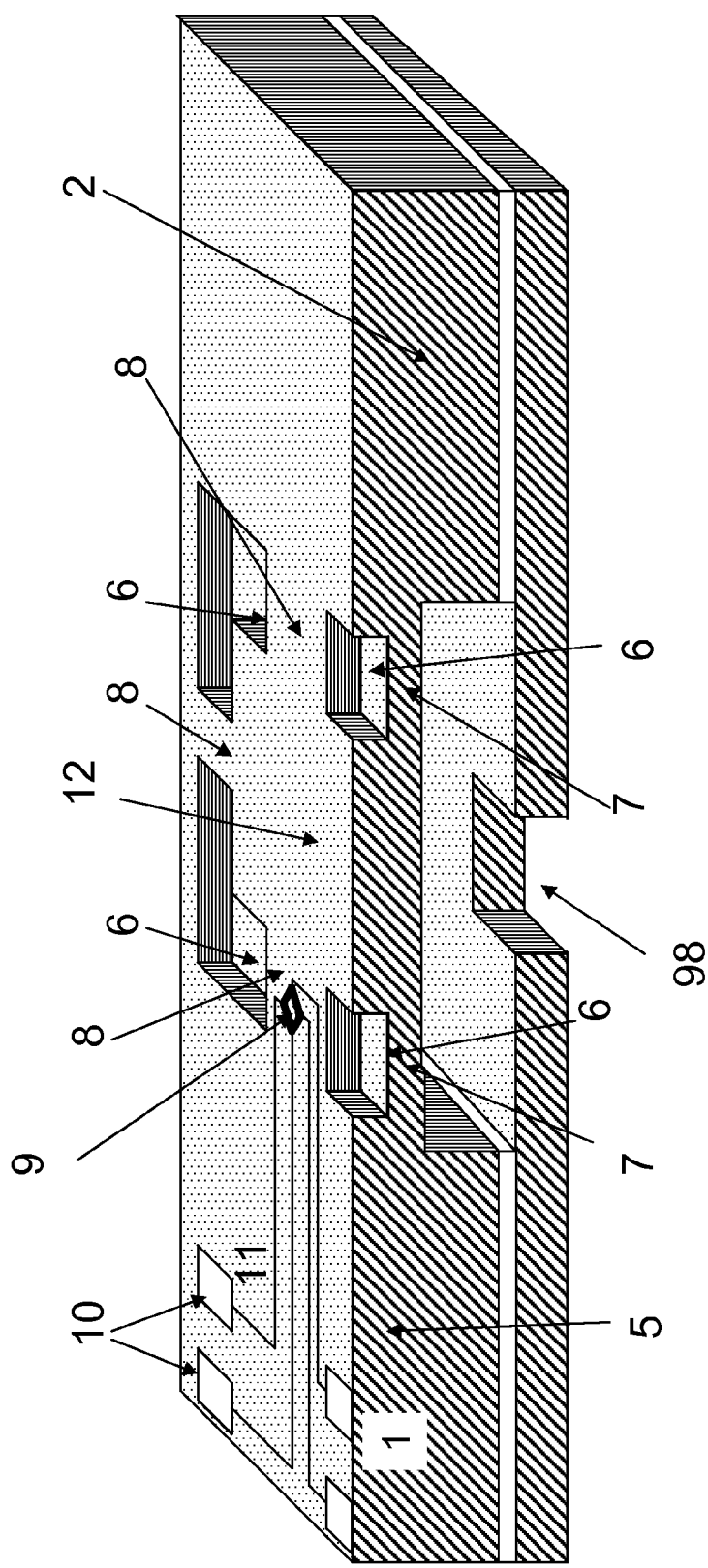
Figure 30:
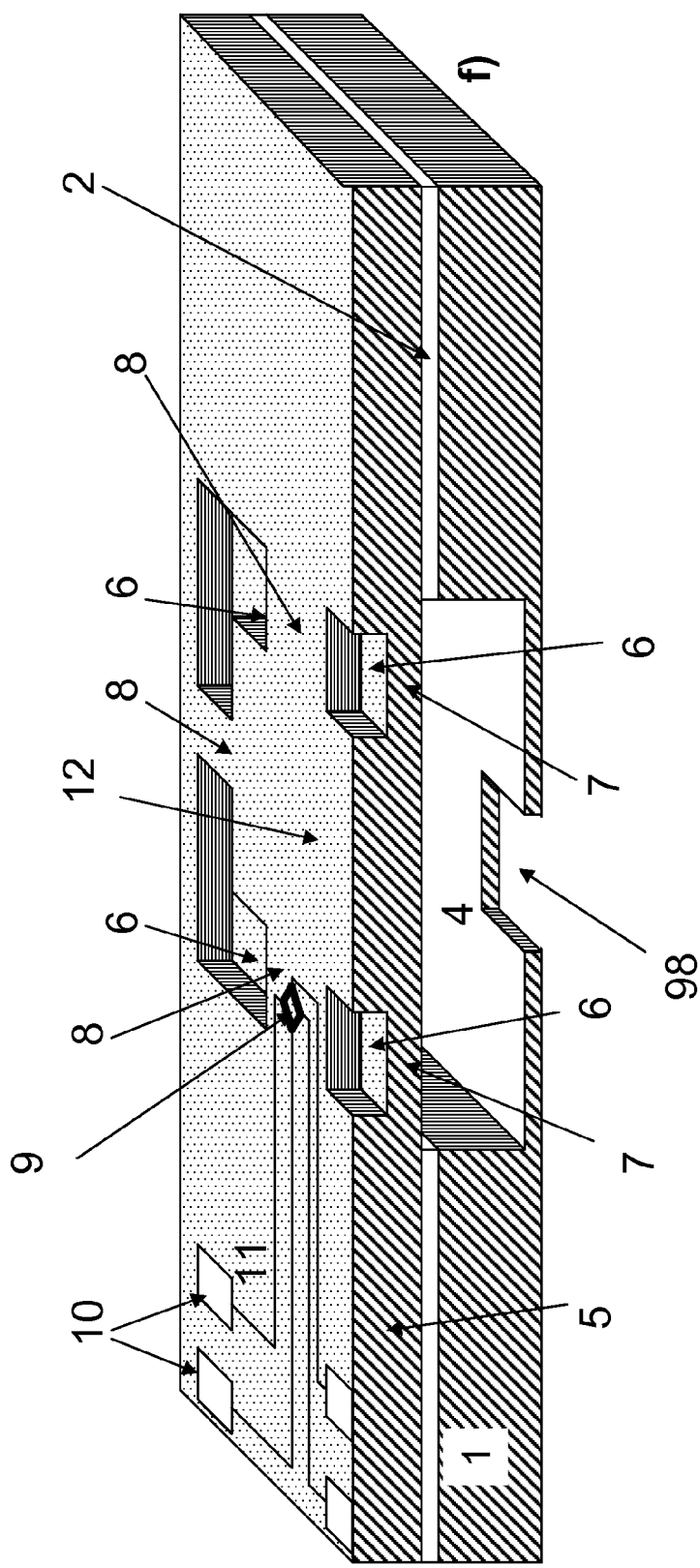

FIGS. 29 and 30
Exemplary differential pressure sensors generated from the above sensors by etching an opening 119.

FIG. 31 View onto an exemplary membrane geometry with round cavity, round outer edge of the trench system, and rhombic central portion
a) plan view
b) view from below.

Figure 32:
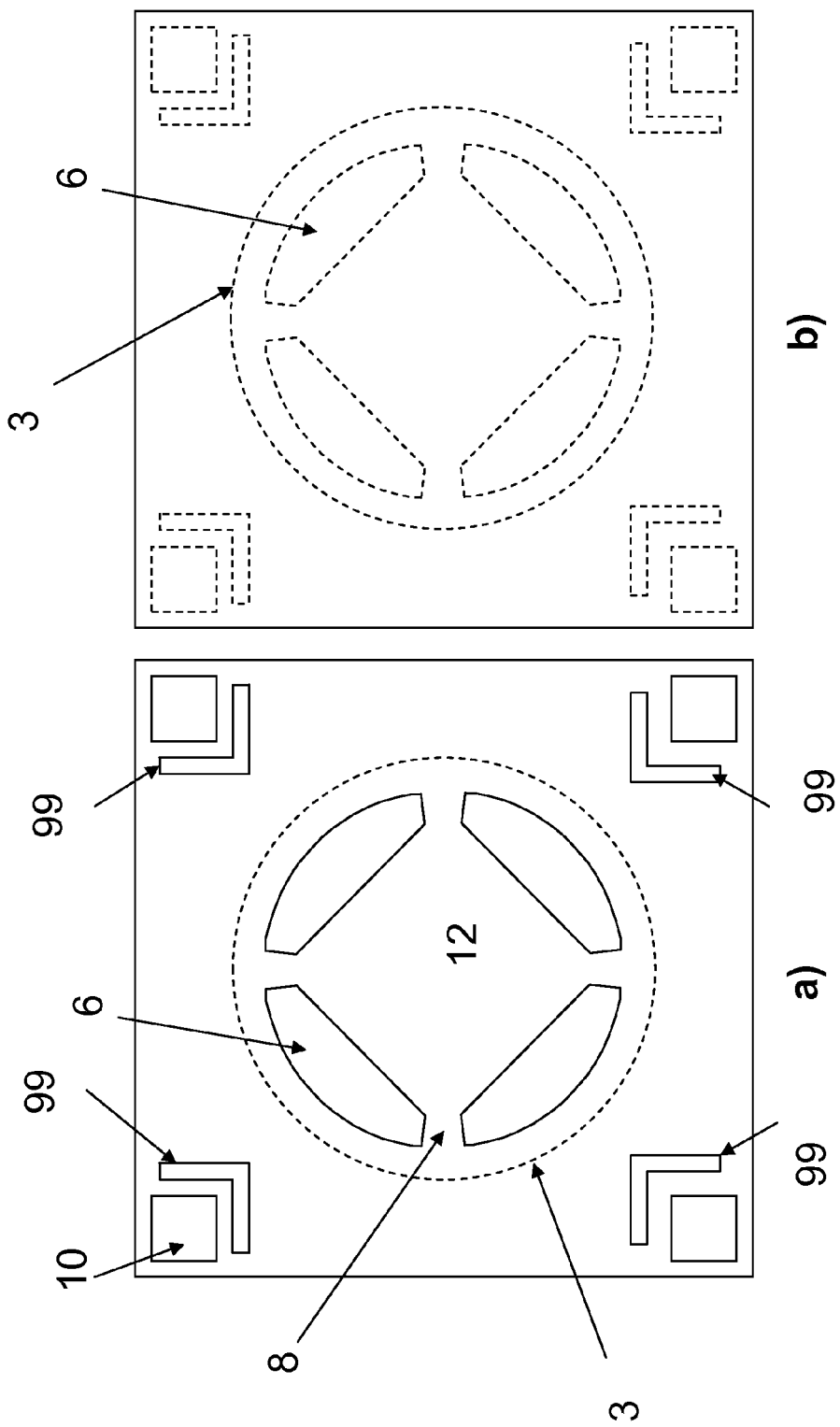

FIG. 32 View onto an exemplary membrane geometry with round cavity, round outer edge of the trench system, and rhombic central portion, and additional trenches for protection of the system against spreading of externally introduced stress
a) plan view
b) view from below.

Figure 33:
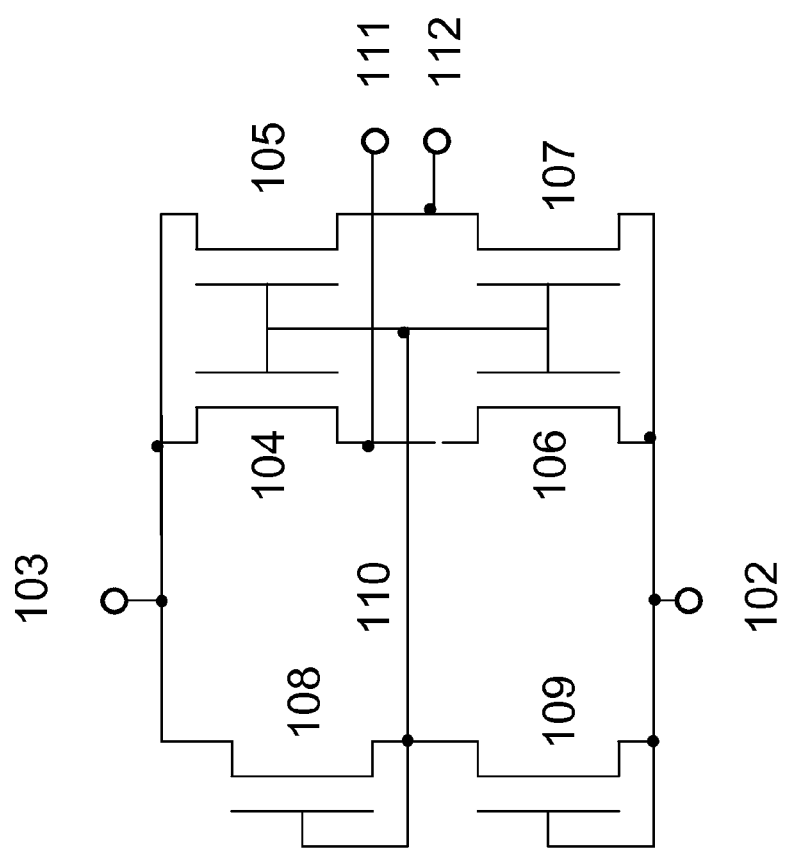
Figure 34:
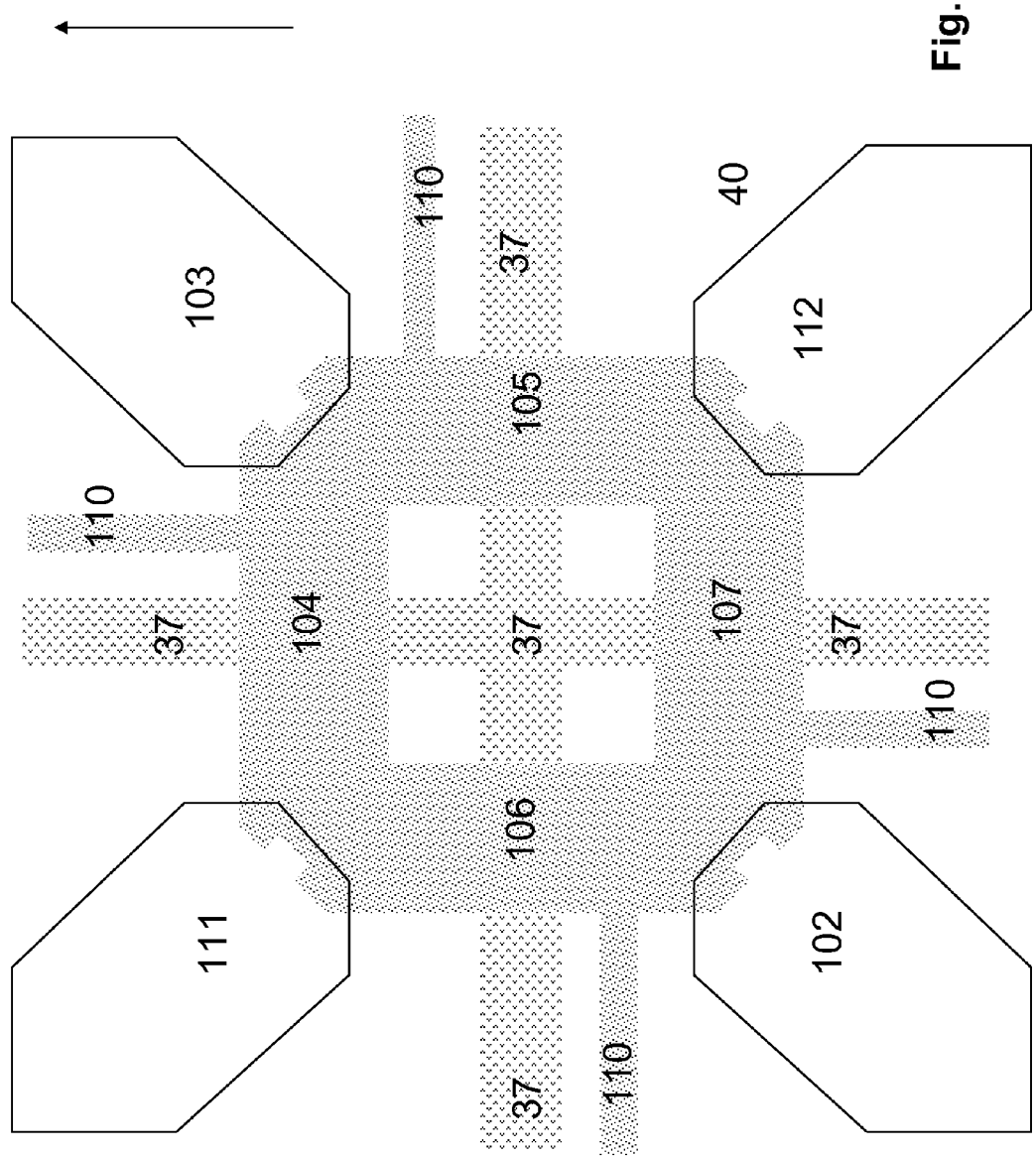
Figure 35:
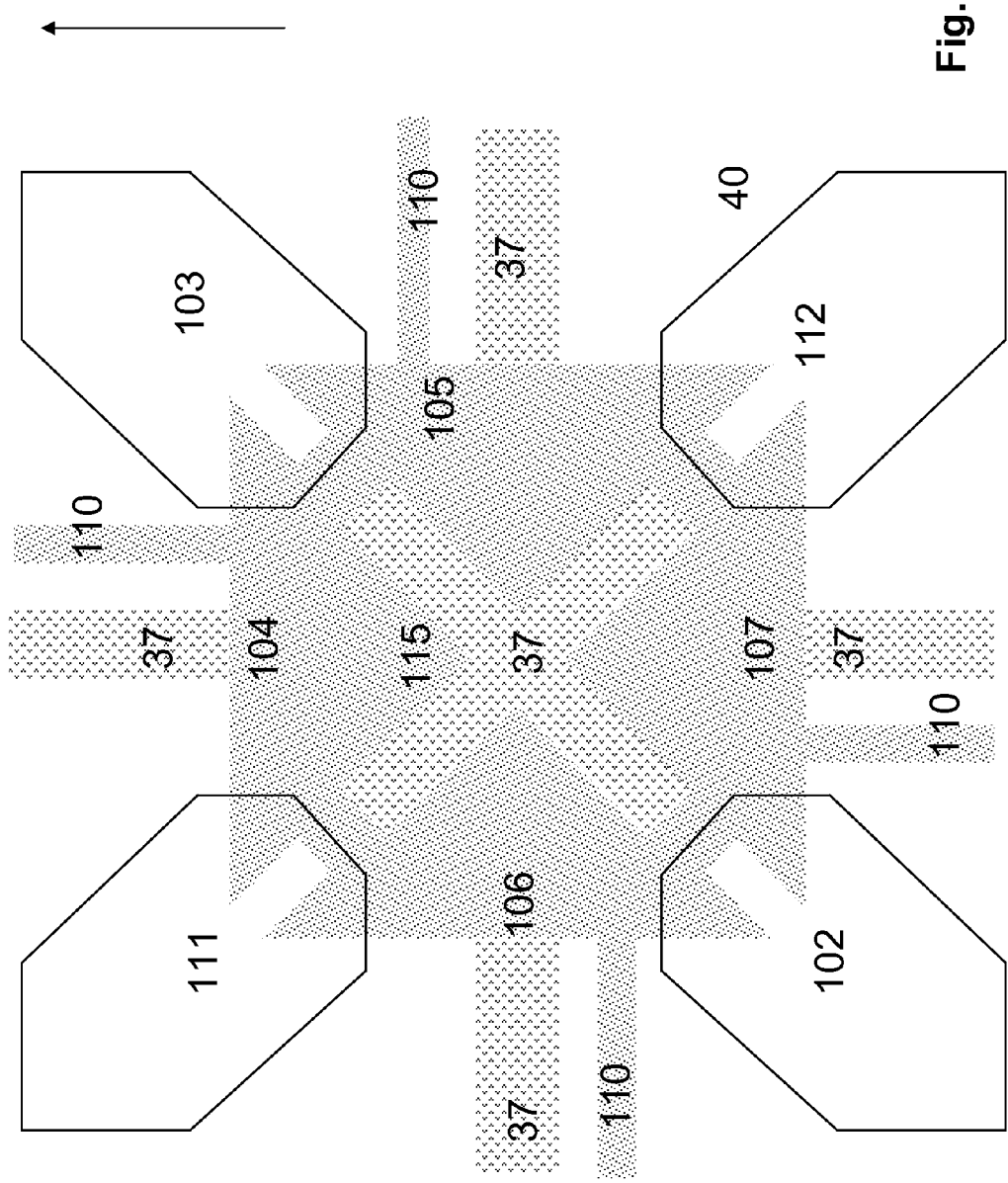

FIG. 33 Circuit diagram of a bridge according to FIG. 34 and FIG. 35 as a measurement bridge with reference voltage source.

FIG. 34 Exemplary layout of a measurement bridge with common gate.

FIG. 35 Further exemplary layout of a measurement bridge with common gate.

Figure 36:
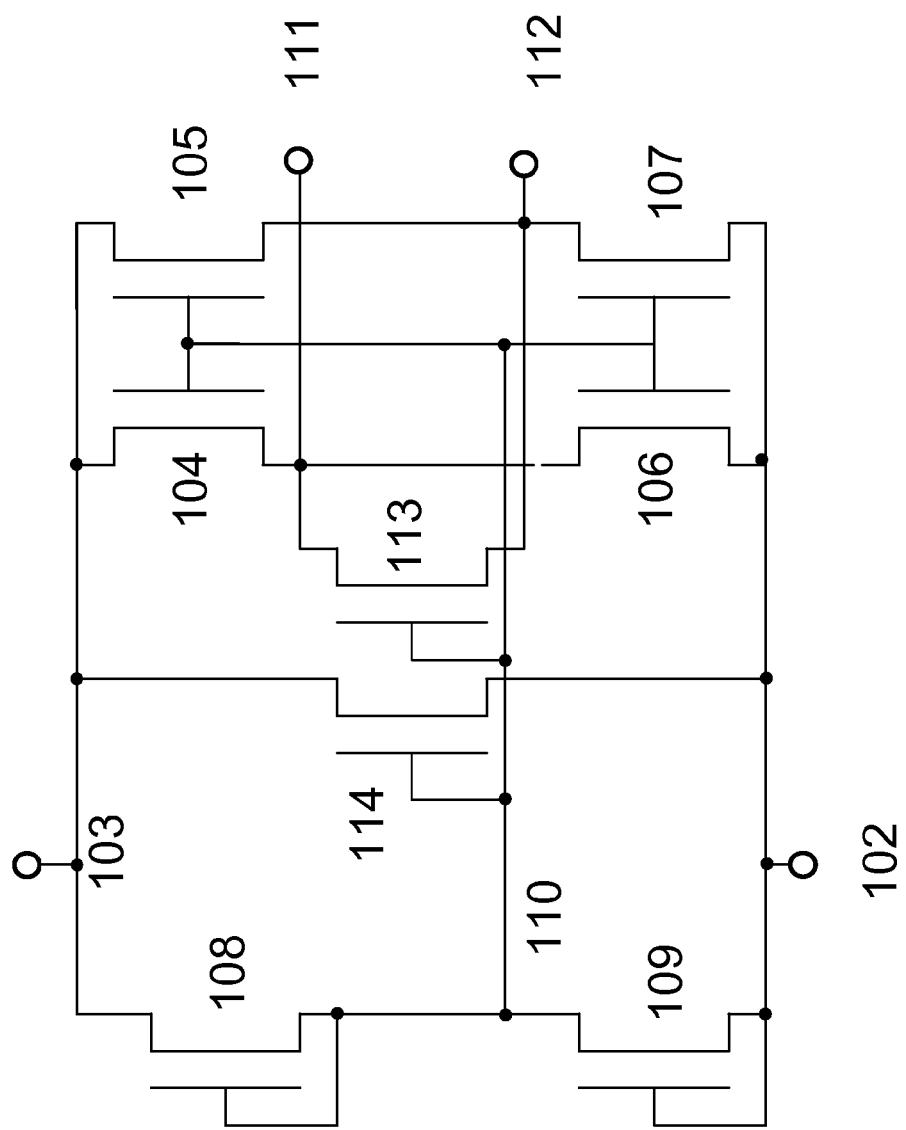
Figure 37:
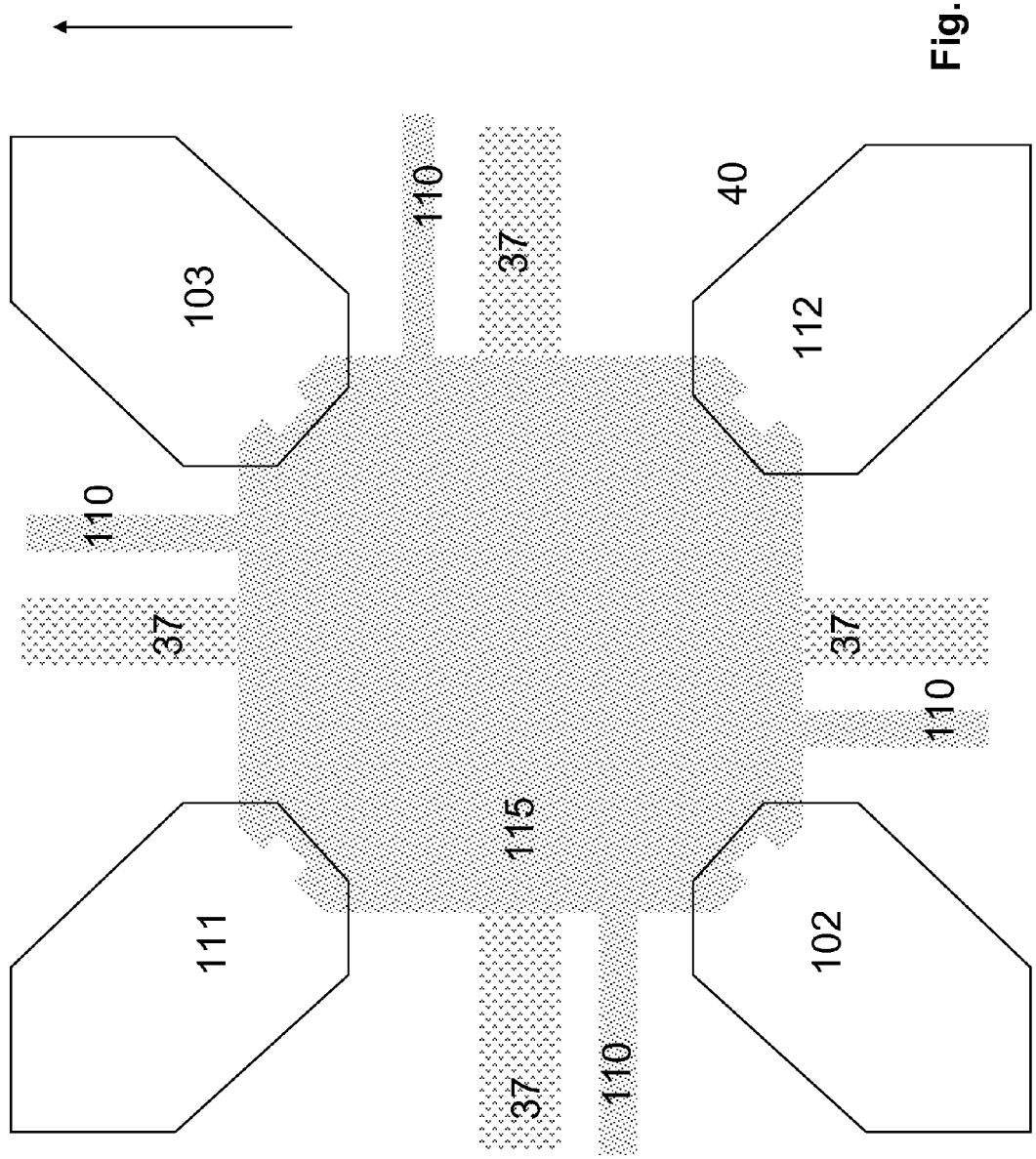

FIG. 36 Equivalent circuit diagram of a transistor according to FIG. 37 as a measurement bridge with reference voltage source.

FIG. 37 Exemplary layout of a particularly small measurement bridge transistor with four connectors.

Figure 38:
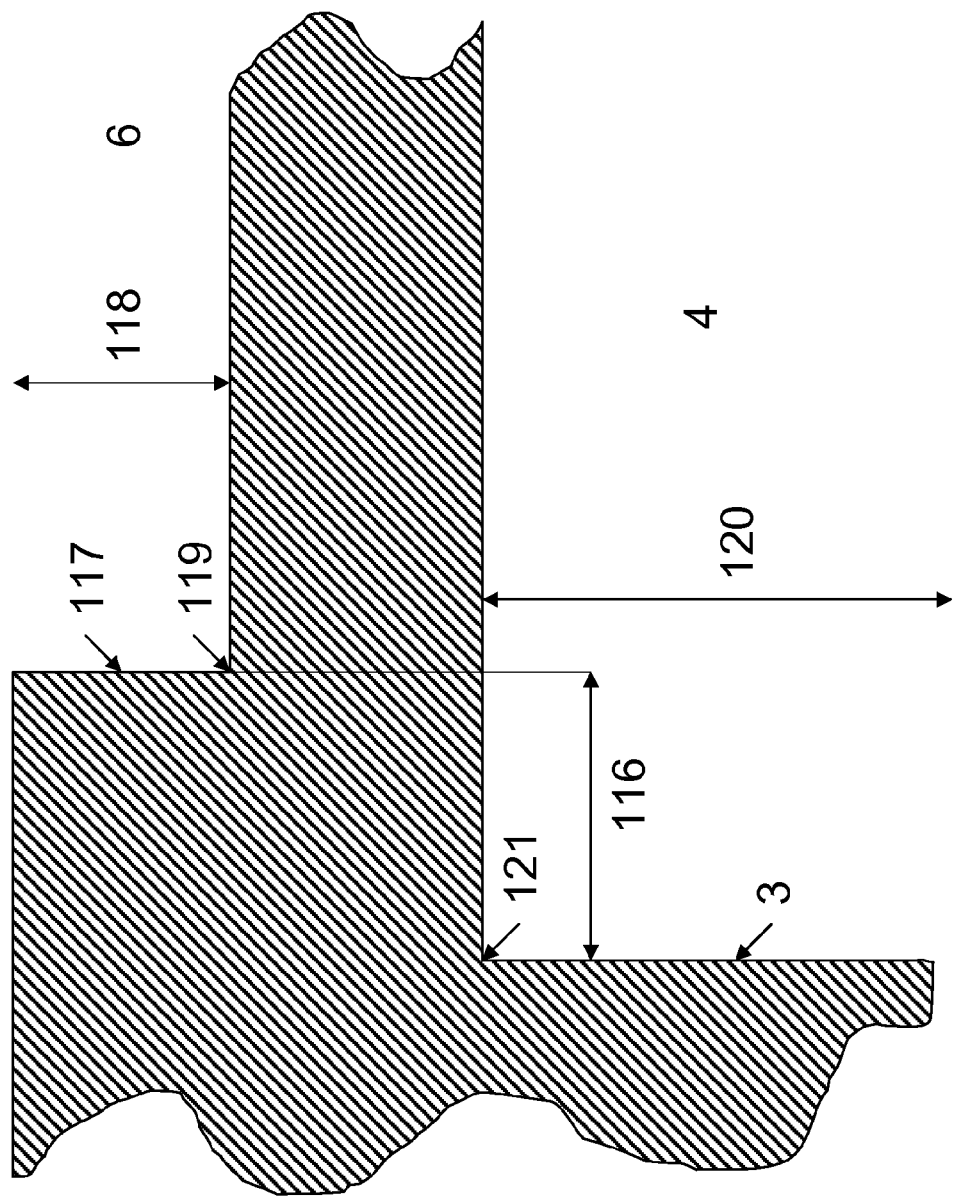

FIG. 38 A detailed view.

Figure 39:
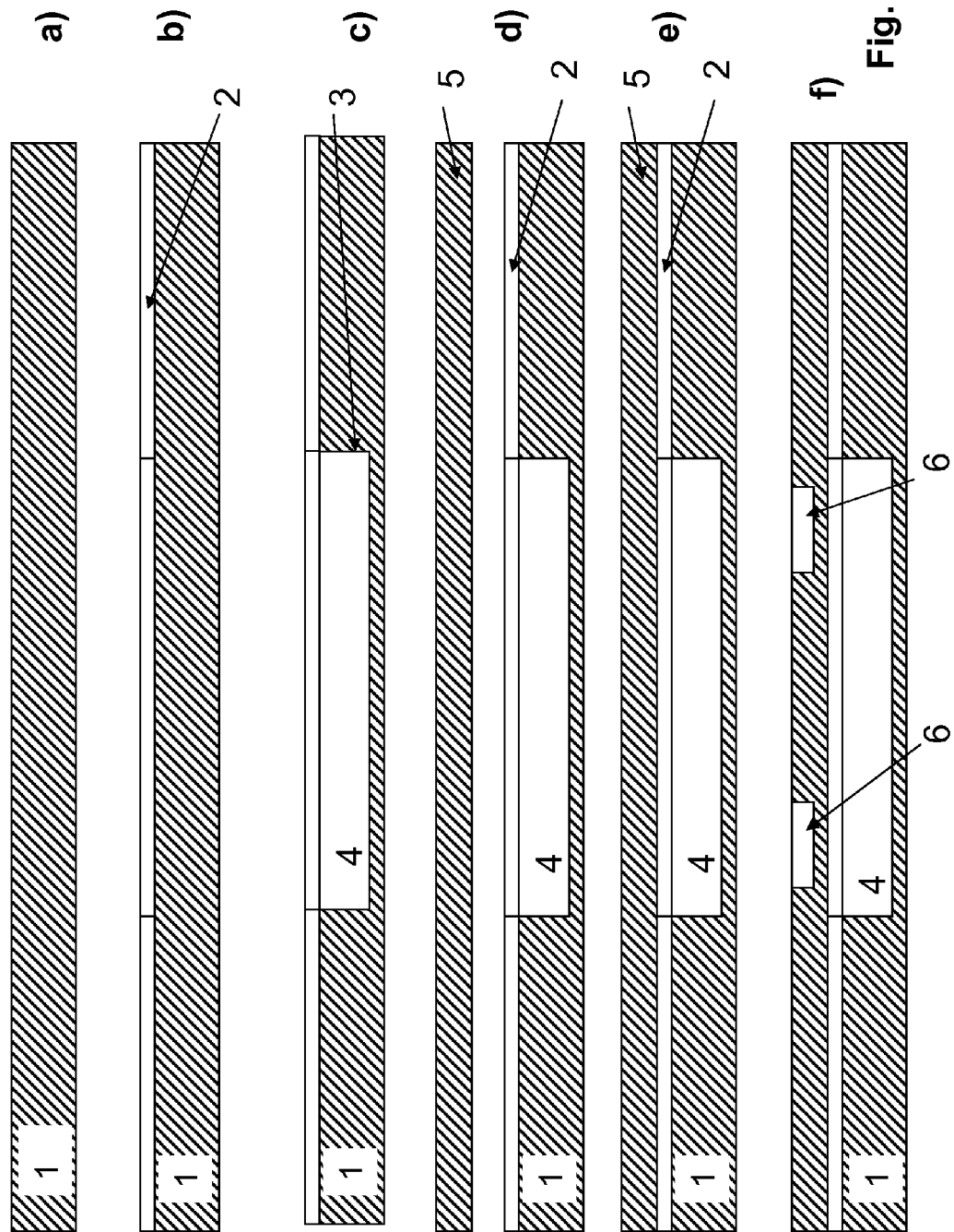

FIG. 39 A schematic view illustrating the individual method steps for preparing and for bonding two semiconductor substrates for producing a differential pressure sensor with buried cavity technology.

Figure 40:
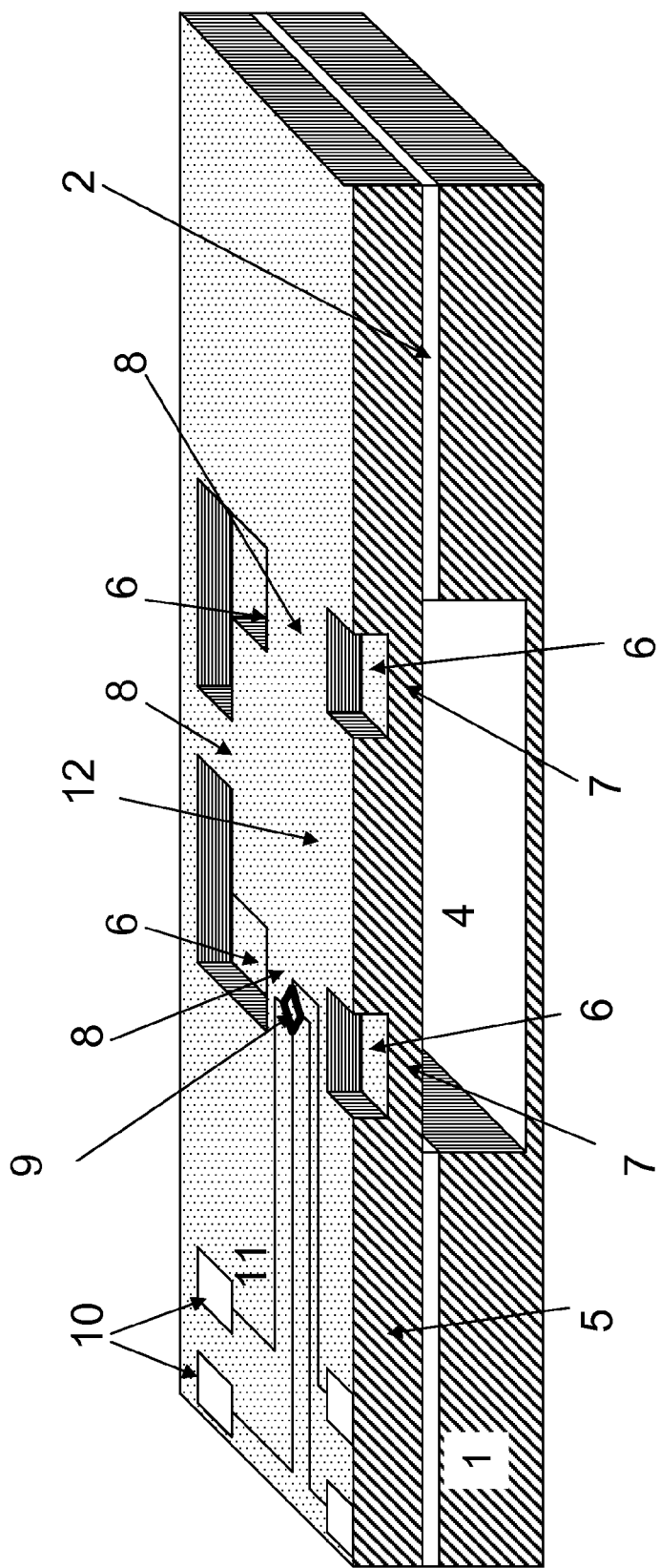

FIG. 40 A view of the absolute pressure sensor produced with the aid of the buried cavity technology.

Figure 41:
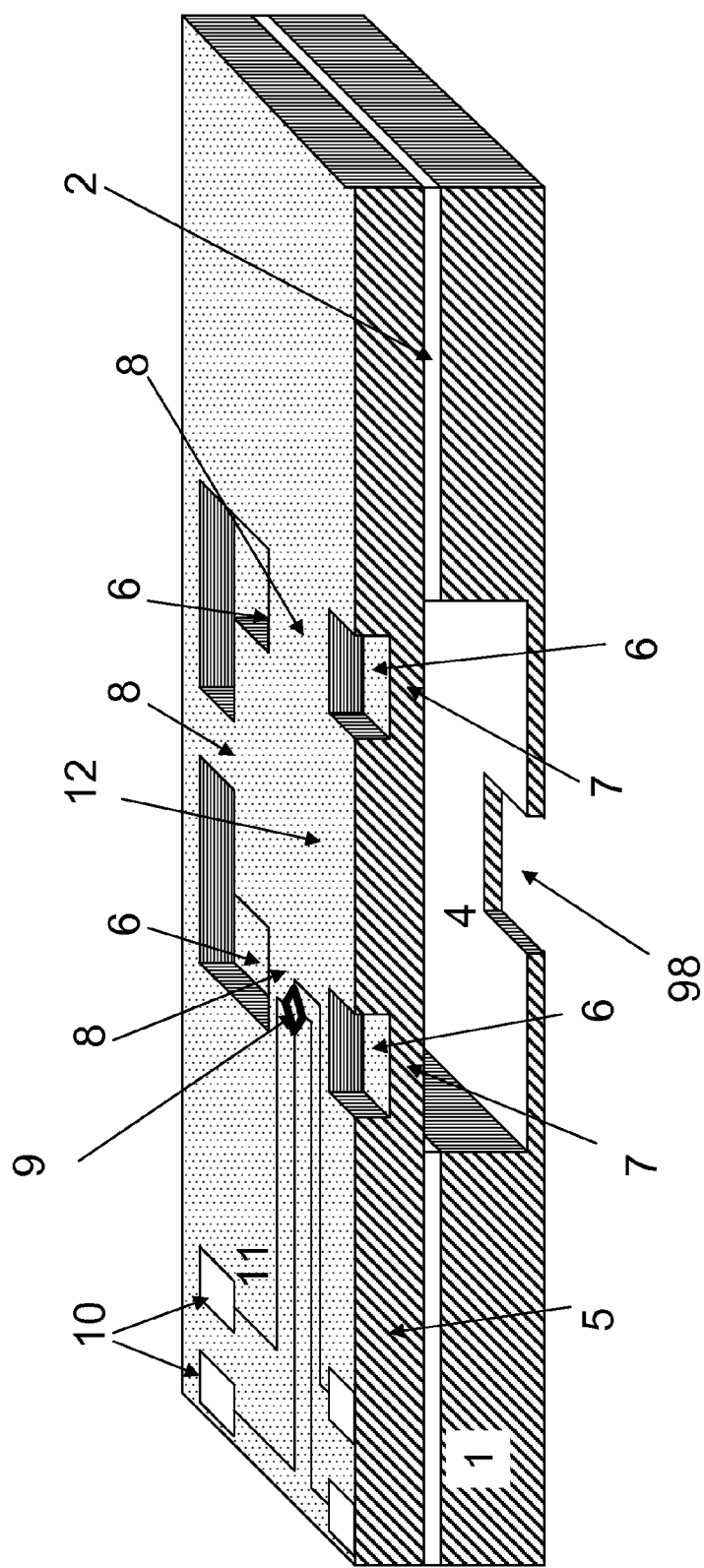

FIG. 41 A view of the sensor according to FIG. 40, but, by generating an etched opening entering the cavity, now in its design as a differential pressure sensor.

Figure 42:
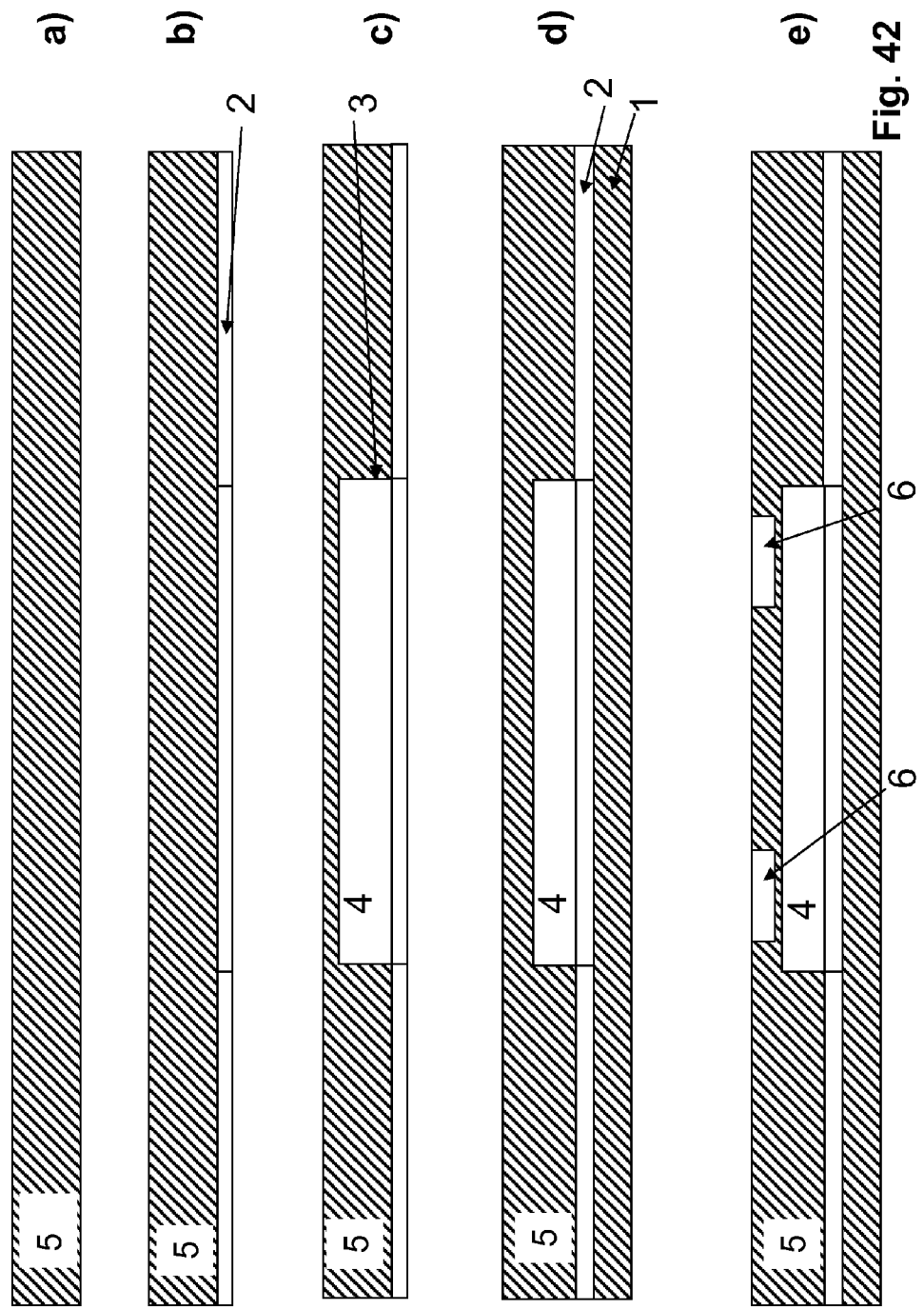
Figure 43:
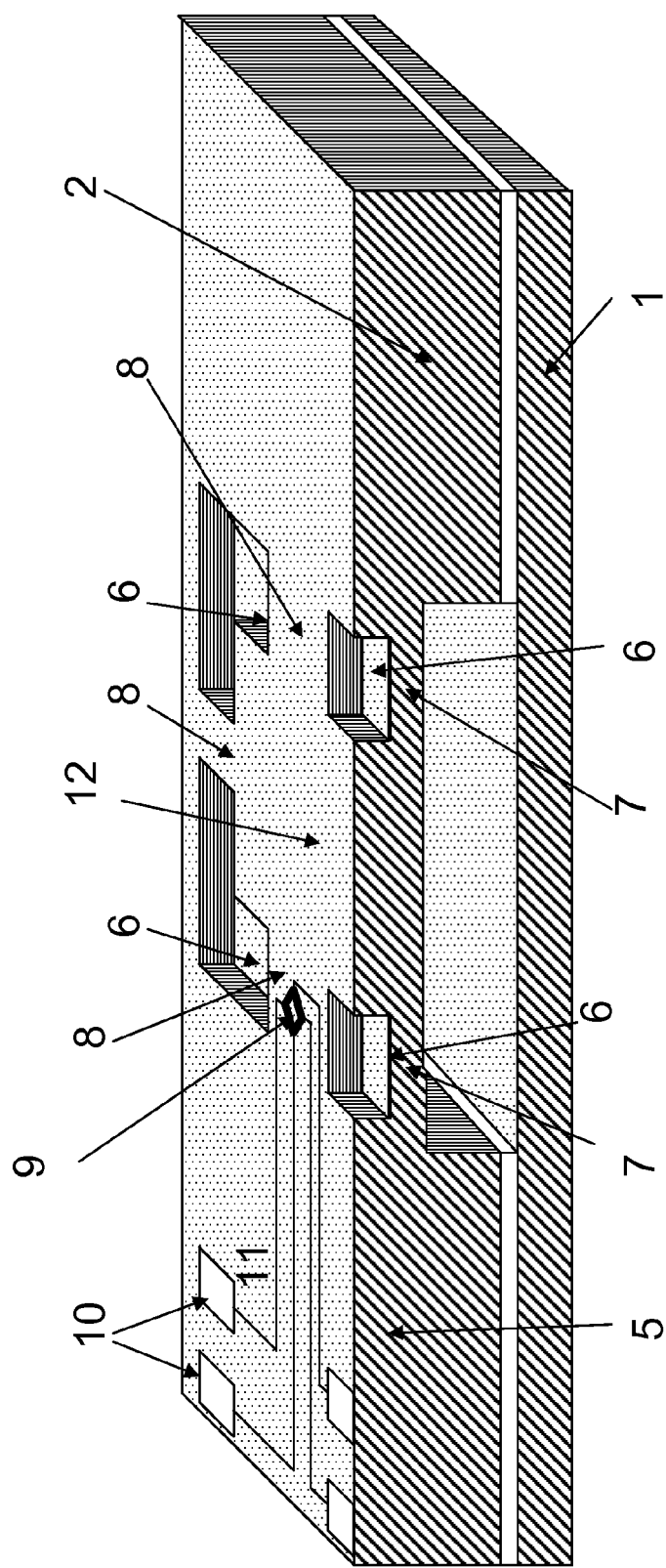
Figure 44:
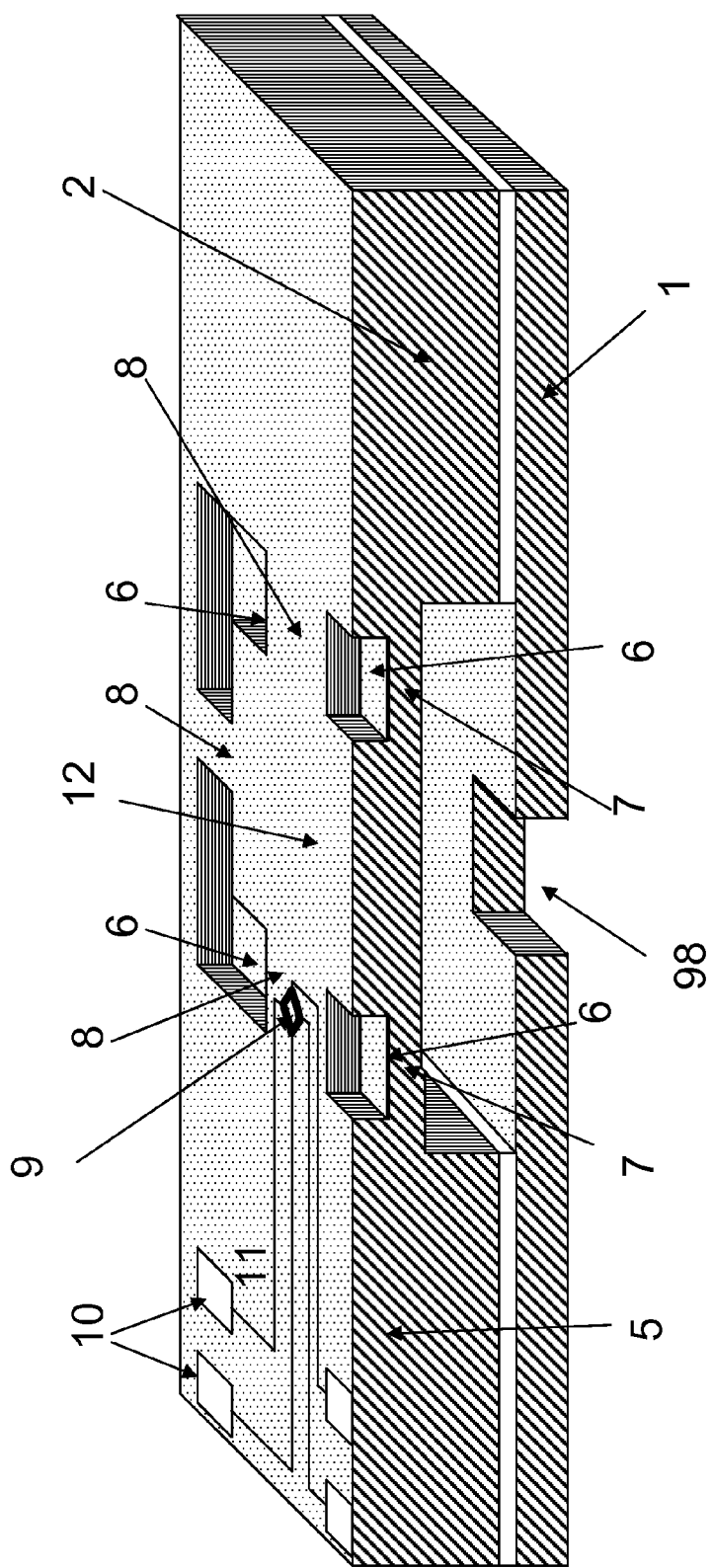

FIGS. 42 to 44
Views of alternative process steps for producing a differential pressure sensor with buried cavity technology.

The invention will be illustrated by way of example of a pressure sensor for detection of low pressures. A first essential aspect of the invention resides in the generating of the pressure sensor cavity 4 prior to the processing of the CMOS steps. Thereby, random standard CMOS processes can be performed on the surface. This makes it possible, as a second essential step, to place CMOS transistors on a membrane in such a manner that they will lie in a region of optimal mechanical stress upon deflection of the membrane. This point can be determined by analytic considerations and/or finite element simulations.

A first exemplary process is represented, by way of essential steps thereof, in FIGS. 1 and 2. Modifications of this first process will be described further below.

The basic manufacturing process starts with a first wafer 1 which preferably consists of the same material as a later used second wafer 5. On this wafer, a layer 2 is deposited which serves for later connection. In silicon wafers, this layer will be formed as a $SiO_2$ layer 2 by oxidation. Within this layer, a window will be opened and the later pressure sensor cavity 4 will be etched (FIG. 1c). Said etching is preferably performed by a DRIE or plasma etching step because particularly the first one will result in straight walls 3.

The upper wafer 5 will likewise be provided with an oxide layer and will be bonded onto the first wafer 1 and be ground (FIG. 1d). The bonding process herein is preferably performed in a vacuum. This will lead to a cavity which is not filled with gas, and will prevent a later temperature dependence of the interior pressure in the cavity. By this process, a membrane is generated in the region of the cavity, whose thickness is determined by the grinding process.

As a result, one will obtain a wafer package which can be used in a standard CMOS process or standard bipolar process in the same way as a normal SOI material.

After the CMOS processing, which does not have to be described in greater detail here because the processing can be gathered from standard literature, further micromechanical structures 6 can then be etched into the surface 11 (FIG. 1e).

In the case of the exemplary pressure sensor, these micromechanical structures 6 are e.g. trench structures forming approximately closed rings or quadrangles which are interrupted only by few webs 8 (FIG. 2). In the middle, there is thus generated a central plate 12—referred to as a boss—which, due to the increased thickness, forms a reinforcement. The bottom of the trenches 6 forms a membrane 7 of reduced thickness. This membrane typically takes up substantially less forces. It is important herein that the outer edge of the trench 6 is sufficiently spaced from the wall of the cavity 3 since, otherwise, small adjustment errors in manufacture would have a massive effect on the mechanical stress and thus on the measurement result. This is a substantial innovation. The reproducibility, under the aspect of production technology, of the sensor properties, would otherwise suffer, which would cause increased expenditure for calibration and therefore would entail corresponding costs.

Thus, the pressure on the central plate 12 is dissipated virtually exclusively through mechanical tension via the webs 8. Consequently, it is reasonable to place onto said webs those components 9 which are sensitive to mechanical stress and are provided to detect this stress. These are connected to the connectors 10 via lines. Thus, by the trenches, the mechanical stress field will be adjusted relative to the stress-sensitive electronic components.

By way of alternative, the cavity can also be etched into the upper wafer. This is correspondingly represented in FIGS. 3 and 4 in steps a to f.

An essential disadvantage of the two above processes is the absence of a natural etching stopper for the etching of the trenches 6. For this reason, the thickness of the membrane at the bottom of the trenches 7 can be controlled only with difficulty. As a consequence, the relative error is comparatively high, causing a dispersion of the sensor parameters.

A third exemplary process which is free of the above disadvantage is represented, by way of essential steps thereof, in FIGS. 5 to 10 and steps a to j.

The manufacturing process starts with a first wafer 13 which preferably is of the same material as the later used second wafer 16. Onto this wafer, there is applied a connection layer which in the case of silicon wafers is a $SiO_2$ layer 14. On this $SiO_2$ layer, a further layer will be deposited, e.g. a polysilicon layer or amorphous silicon layer 15, and will be superficially oxidized (FIG. 5c). The depositing of this layer typically can be controlled very well and thus will be considerably more precise in its result than the etching of the trenches in the first two described processes. The second wafer will be oxidized as well, thus likewise generating an oxide layer 17. In this layer, at least one window will be opened and the later cavity 18 will be etched. Said etching is preferably performed by a DRIE etching step because this step will result in straight walls (FIG. 6f). It is of course also possible to etch the cavity 18 into the upper wafer 13, but this will not be described in greater detail hereunder.

Figure 8:
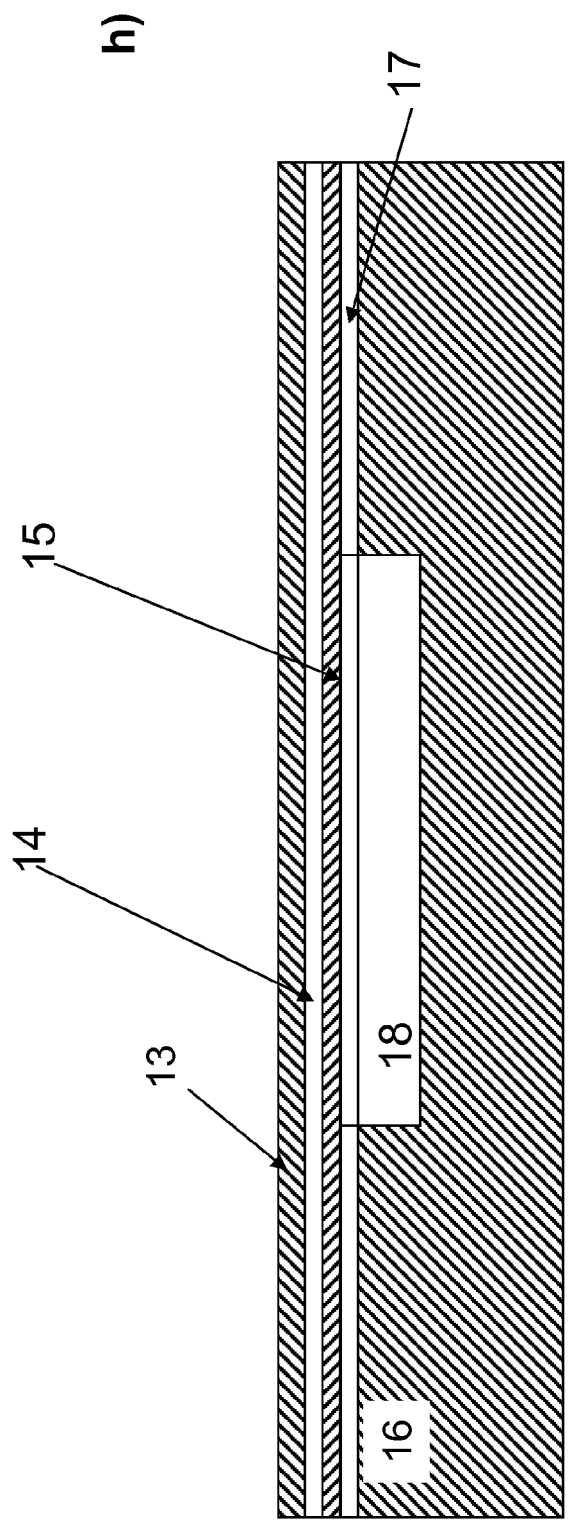
Figure 9:
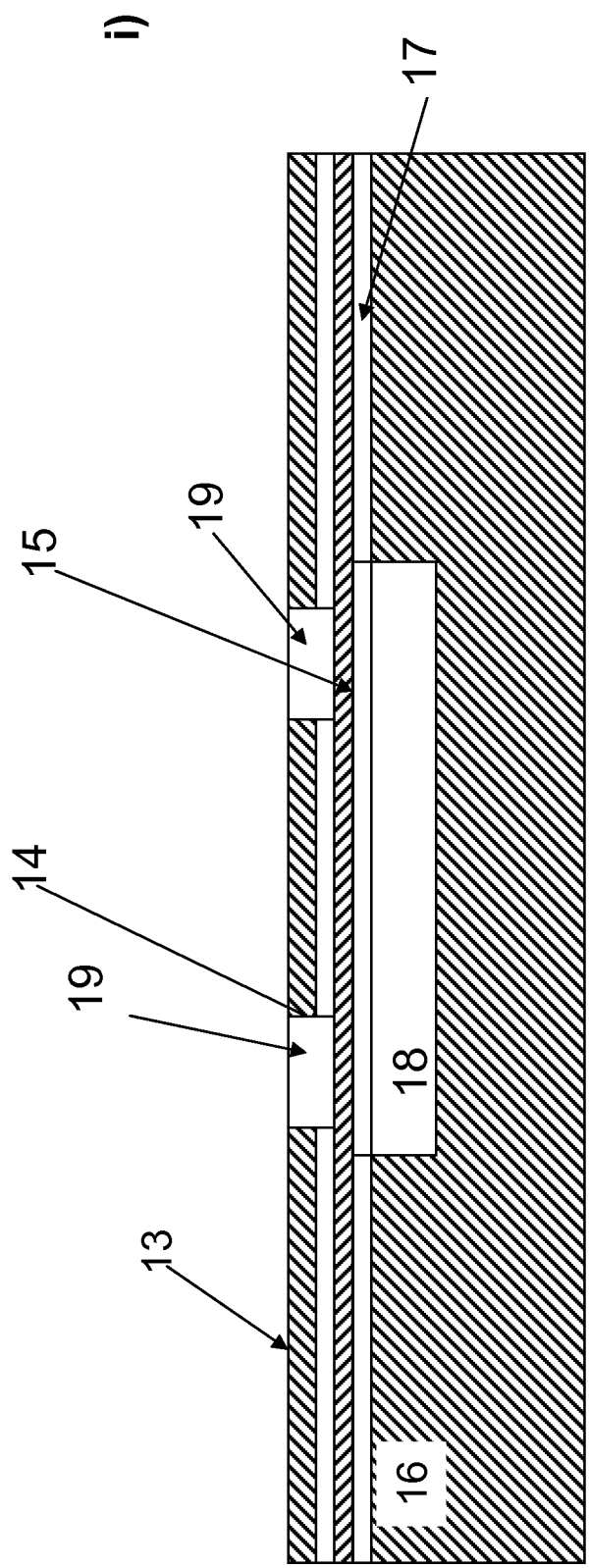
Figure 10:
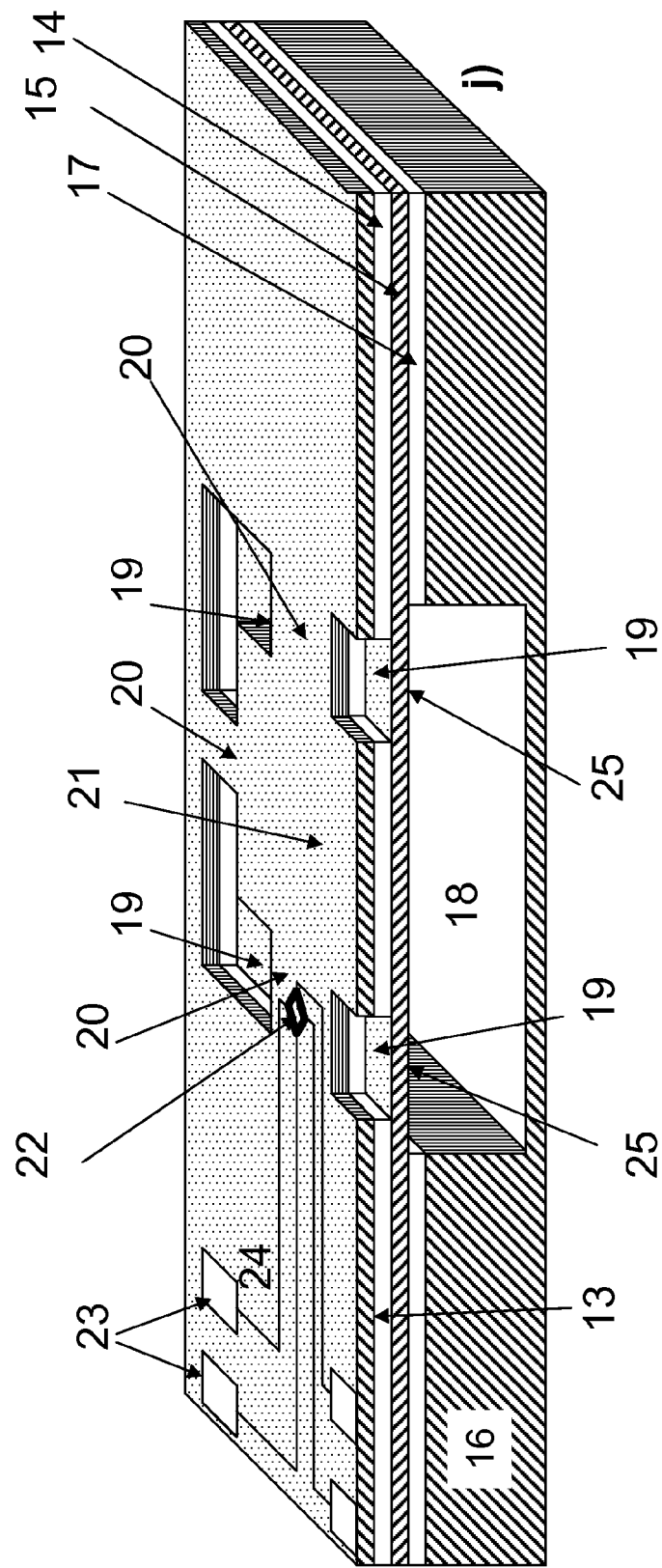

The upper first wafer 13 will be bonded onto the second wafer 16 (FIG. 7) and subsequently will be grinded (FIG. 8). The bonding process herein will preferably again be performed in a vacuum so as to exclude a later temperature dependency of the interior pressure in the cavity 18. By this process, a membrane is generated in the region of cavit, whose thickness is determined by the grinding process.

As a result, one will again obtain a wafer package which in principle can be used in a standard CMOS process or standard bipolar process in the same way as a standard wafer.

After the CMOS or bipolar processing, further micromechanical structures, e.g. trenches 19, can then be etched into the surface 24 (FIG. 10) as in the above describes processes.

In the case of a pressure sensor, these micromechanical structures 19 are again e.g. trench structures forming approximately closed rings or quadrangles which are interrupted only by few webs 20. In the middle, there is thus again generated a central plate 21 which, due to the increased thickness, forms a reinforcement. The bottom of the trenches 19 forms a membrane 25 of reduced thickness. This membrane typically takes up virtually no forces. In contrast to the first method, the additional layer 15 and the resultant additional oxide layer 14 make it possible to stop the etching of the trenches 19 with greater precision than in the first method. Thereby, the electromechanical properties can be realized more precisely and with better repetitive accuracy.

As in the result of the first process, the pressure (see FIG. 10) on the central plate 21 is dissipated virtually exclusively via the webs 20. Consequently, it is again reasonable to place onto said webs those components 22 which are sensitive to mechanical stress and are provided to detect this stress. These are connected to the connectors 22 via lines.

Of course, it can also be envisioned, instead of using a depositing process, to produce said additional layer 15 by bonding and grinding a third wafer. Further, it can be envisioned to integrate more than one buried insulated layer of the type of said additional layer 15 into a wafer packet.

With a wafer package generated in this manner, it is possible again to produce stress-sensitive sensors on the membrane after their production prior to generating the trenches (6 or 19).

To this end, in a CMOS or bipolar process, stress-sensitive electronic components are produced on the respective surface 11,24 and are connected. For a CMOS process, preferred use is made of a p-doped substrate.

For instance, piezoelectric resistors can be placed on the webs 20,8 and be connected to form a Wheatstone bridge. These, however, have the disadvantage that they first must be brought onto the operating temperature and will consume relatively much electrical energy during measurement. Thus, they are unsuited for energy-autonomous systems. As already described above, the invention also aims at eliminating this problem.

Thus, in place of such simple electronic components, it is reasonable to use actively amplifying components such as e.g. bipolar transistors and MOS transistors. These can again be connected to form a Wheatstone bridge but will need no warm-up time and will consume less energy. An exemplary circuit arrangement is shown in FIG. 12.

Herein, four p-channel transistors 85,86,87,88 form a Wheatstone bridge which can be sensed at the two terminals 89,90. The transistors 87 and 85 herein are designed with the same orientation, and also the transistor pair 88,86 is given the same orientation but is arranged vertically to the transistor pair 87,85. However, this circuit is highly sensitive to manufacturing faults.

Now, to make it possible to produce such a MOS transistor circuit with sufficient accuracy, the transistors have to be designed in such a manner that the electrically active part is self-adjusting. FIG. 11 shows an exemplary layout of such a self-adjusting transistor. Herein, the p+-contact implantations 80 and 79 are shaded by the poly gate 81 in such a manner that, also in case of displacement, there will always be maintained the same transistor channel length and transistor width. The poly gate 81 also shades the n+-channel stopper implant. The gate is connected via a low-impedance poly line.

Thus, it is safeguarded that the transistors of identical design geometries have a similar geometry in their physical realization. This geometry is determined substantially by the design of the polysilicon surface.

To bring the transistors to the respective correct operating point, it is suitable to also integrate a reference voltage source on the pressure sensor. In the example (FIG. 13), the exemplary reference voltage source consists of the transistors 30 and 29. The transistors 31,32,33,34 again form a Wheatstone bridge which can be sensed at the terminals 28,36. Both are connected as MOS diodes by connection of the gate to the drain. The reference voltage of transistor 30 is connected to the gate of transistors 31 and 33. The reference voltage of transistor 29 is connected to the gate of transistors 32 and 34. In the example of FIG. 13, the drain of transistor 29 is on the potential of terminal 26. In p-channel transistors, this terminal is typically connected to ground. Therefore, the drain contacts of transistors 32 and 34 are likewise connected to this terminal. The transistors are preferably realized with identical geometric dimensions. An example of the layout of a local Wheatstone MOS bridge is illustrated in FIG. 14. If the transistors are arranged as in FIG. 14, the transistors 31 and 34 are oriented identically. The transistors 23 and 33 are also oriented identically relative to each other but vertically to transistors 31 and 34. FIG. 14 shows an exemplary arrangement.

To keep the mechanical distortion on the membrane at a minimum, the membrane is not provided with a field oxide but only with a full-surfaced, extremely thin gate oxide of a few nm and a suitable passivation. If the application of a field oxide is unavoidable, high symmetry is recommendable so as to keep parasitic effects on all stress-sensitive components at an identical level. In a silicon pressure sensor, for instance, the passivation can consist of silicon nitride. This has a low hydrogen diffusion coefficient and thus will protect the component against in- and out-diffusion of protons which, particularly in case of a permanently applied voltage and a high operating temperature may cause a drift of the p-resistors and the p-channel transistors. This effect is known as NBTI. In order to avoid any possible kind of mechanical distortion, no field oxide or the like will be generated near mechanical components or even on these. Therefore, particularly the membrane of the exemplary pressure sensor is covered only with the gate oxide and the passivation layer, silicon nitride. Further, the feed lines on the die will be realized, if possible, not in metal, which has a high thermal expansion coefficient particularly relative to silicon, but in the wafer material and, in case of silicon, as a high-doped layer or as a high-doped polysilicon or, if not possible otherwise, as a high-doped amorphous or polycrystalline silicon. In this example (FIG. 14), the drain and source feed lines of the transistors 26,28, 35,36 are realized e.g. as p+-implants 36,35,26, 28. The gates and their feed lines are realized e.g. in polysilicon 33,39,31 and 32,34,38. In the surface 40 which will be n-doped, no channel will be formed in this example, which is due to the field threshold. This will be possible only at the edge of the poly gates. For this reason, there is implanted a n+-channel stopper 37 which will interrupt parasitic forces. By this exemplary all-silicon realization, it is thus possible that the element sensitive to mechanical stress can be kept very small and insensitive to manufacturing tolerances and thermomechanical stress caused by foreign materials, so that the sensitivity to inhomogeneous stress distribution will be further reduced. In spite of these provisions, there still exist marginal differences between the materials. For this reason, when designing the electronic components on the die, and particularly in components arranged on the membrane, care is taken to maintain the highest possible symmetry. Thus, it is reasonable that components which are used for differentiation—e.g. those in Wheatstone bridges or differential amplifiers—are placed as closely together as possible so as to minimize the influence of manufacturing inhomogeneities.

FIG. 15 shows a further variant of the Wheatstone bridge. Therein, the reference voltage by which the bridge consisting of the transistors 31,32,33, 34 is operated, is generated from a bridge similar to that one, consisting of transistors 30,29, 55,56. Suitably, herein, use is made of the same layout module. The reference bridge will be short-circuited, thus generating the reference voltage 35 by which the transistors 31,32, 33,34 of the first bridge are controlled. The second bridge will be placed on the substrate as far away as possible from the mechanical tensions but still as close as possible to the first bridge. This serves for keeping the manufacturing variations between the bridges as small as possible. The first bridge will be placed at the point of suitable mechanical stress. This is the point where a mechanical stress as high as possible will be generated upon deflection of the exemplary membrane while, however, this stress is still so homogenous that manufacturing variations will not yet be perceived too massively.

For further minimization of influences of misalignment, it can be reasonable to place a plurality of bridges on one die. This can be effected e.g. by a placement as shown in FIG. 16. Here, there is shown the possible placement of four bridges according to FIG. 12. FIG. 17 shows the placement of bridges and reference bridges according to FIG. 15. In an arrangement as shown in FIG. 17, three levels of compensation exist. On the first level, the level of the four transistors, the direction of the mechanical stress will be detected. This is performed by comparison between values of transistors arranged mutually vertically. On the next level, these four transistors in their totality 43 will be compared to four further, similarly arranged transistors 58 located close to the first four ones, 43, but in a mechanically less stressed region, ideally on the neutral fiber. Thereby, the mechanically induced offset of the bridge will be differentiated from that offset which is caused by adjustment errors during manufacture. If the sensor is symmetric, it is reasonable to install eight further transistors, according to the number of positions on the axis of symmetry. In the example (FIG. 17), these are four pairs of sensors 44,57;41,60;42,59;43,58, each pair consisting of two by four transistors.

Theoretically, the placement of a single transistor is already sufficient for stress measurement. In this case, however, all manufacturing errors will already have a massive effect.

A first alternative layout is shown in FIG. 34. FIG. 33 shows the appertaining circuitry with a reference voltage source consisting of the transistors 108, 109. Here, the four transistors 104,105,106,107 connected to form a Wheatstone bridge have a common gate 110, which simplifies the layout. Via the terminals 103 and 102, the bridge is supplied with voltage. In case of a mechanical distortion of the bridge, an electric voltage will appear at the terminals 111,112. FIG. 35 illustrates a further variant of this bridge. If the channel stopper 37 in the middle of the bridge is omitted, this results in a field-plate-like transistor 115 with four terminals (FIG. 37). FIG. 36 shows the equivalent circuit diagram of transistor 115. Added thereto are then the transistors 114 and 113 which, on the one hand, increase the current consumption, 114, and, on the other hand, reduce the signal level, 113. As a benefit thereof, however, the design size and thus the space requirement can be minimized, which in some applications is very useful.

An alternative layout arrangement of the transistors of a sensor element 41,42,43,44,57,58,59,60 is shown in FIG. 18. Here, the four transistors 44,45,46,47 are arranged in a star-shaped configuration. They have a common drain contact 50 which via a feed line 49 is connected to a current source that is not located on the membrane of the pressure sensor. The gates of the transistors 44,45,46,47 are connected by a poly line 48. The source contacts are respectively connected by a highly doped p+-conduit 51,52,53,54. The four transistors are e.g. components of a differential amplifier as shown in FIG. 19. All other transistors of FIG. 19 are not arranged on the membrane but on the substrate without underlying cavity. It is obvious that already half of the four transistors, i.e. for instance the transistors 45 and 44, would be sufficient to form a differential amplifier. For reasons of symmetry, however, the variant comprising four transistors is recommendable.

The circuit consists of two differential amplifiers. The left-hand amplifier (transistors 65 to 73) is short-circuited in the output and the input and operates as a reference voltage source for the operation of the second amplifier. These transistors are arranged in a region which is free of mechanical stress. The above described transistors 44,45,46,47 form the differential stage with the respective appertaining "working resistors" 61,62,63, 64. The current source 74 supplies current to the thus formed differential amplifier. The transistor 74 in this example is an n-channel transistor. In operation, the outputs of the differential amplifier 77,78 will reflect an asymmetry of the transistors 44,45,46,47 due to mechanical stress. Since the transistors 46 and 44 are oriented differently from the transistors 45 and 47, a uniaxial mechanical stress will result in an output signal at 77,78. The differential amplifier in this example will be brought to the working point by a similarly designed, short-circuited reference differential amplifier. The latter and the transistors 61,62,63,64,74 are suitably arranged not on the membrane but in a region of the die which is nearly free of mechanical stress. In order to guarantee the congruence of the electrical parameters of the components in the stress-free state, these should nonetheless be placed as close to the other transistors as possible. Thus, the orientation and the layout of all elements suitably will be realized as closely adjacent as possible and with the same orientation so that particularly also the current-mirror pairs will be well attuned to each other.

FIGS. 20 to 25 show different embodiments of the trenches and cavities.

In the design of the race track 6 and the cavity 3, various factors have to be considered:
1. A suitable distance has to be maintained between the race-track outer wall and the cavity wall.
2. The circle passing through the outer contact points of the webs with the race-track outer wall is not to be intersected by the race-track outer wall because this would result in a distortion of the mechanical stress field in the boss 12.
3. The connecting lines between the base points of the webs 8 on boss 12 is not to be intersected by the outer edge of the boss because this would result in a distortion of the mechanical stress field in the boss.
4. The construction should, if possible, comprise no corners because very strong voltages could occur in these, causing nonlinear effects and bi-stability.

Opposed to the above demands are demands with regard to the burst pressure. If the race-track surface becomes too large, the race-track membrane will break more quickly.

To decouple the membrane from mechanical stress caused by the design a and the connection technology, it is thus reasonable e.g. to generate a further trench 93 around the sensor (FIG. 26) and in this manner to generate a virtually larger race-track membrane without the above mentioned danger of breakage.

Herein, the sensor is suspended on webs 94. In the ideal case, these are no extensions of the webs 8 on which the boss 12 is fastened. Thereby, mechanical stress will be transmitted to the sensors 9 only indirectly from outside.

This principle can still be continued by a further trench 95 and further webs 96 (FIG. 27).

The construction with the aid of a boss will lead to an increased sensitivity to seismic stresses. This sensitivity can be lowered by reducing the boss mass (FIG. 28). For this purpose, a suitable support structure will be etched into the boss 97. There will remain webs which, if suitably selected, will generate a sufficient areal moment of inertia for guaranteeing the mechanical stability. The sensor 22 herein will be placed, as above, on a web 20 interrupting the race-track trench 19.

In case that, instead of an absolute pressure sensor, a differential pressure sensor is to be generated, this can be performed by subsequent etching of an opening 119 into the lower wafer. FIGS. 29 and 30 show corresponding exemplary shapes. The advantage of such a construction resides in the small opening and thus in the only very small loss of stability in comparison to a sensor wherein the cavity was etched from the rear side.

The bonding system normally is made of metal having a considerably deviating thermal expansion coefficient. Further, the metal will cause hysteresis effects. Thus, it is reasonable to decouple the bond pads 10 from the rest of the sensors as far as possible. This can be effected by mechanical guard rings in the form of trenches 157 which e.g. will be laid as far as possible around the pads or to-be-protected parts (FIG. 32).

Hereunder, with reference to FIGS. 39 to 43, alternative production methods for generating a differential pressure sensor of the invention as configured by buried cavity technology will be discussed again. In this context, it is to be pointed out that the details shown in FIGS. 39 to 43 are to be understood e.g. as described further above.

According to FIG. 39, there is first applied, onto a handle wafer 1 (first semiconductor substrate—see FIG. 39*a*), an oxide layer 2 (see FIG. 39*b*) into which a window (see again FIG. 39*b*) will be etched by photolithography. Then, by use of an etching process (e.g. DRIE or KOH) a cavity 4 will formed in the semiconductor substrate 1. Through the type of the etching process used, the slant or inclination of the side wall of the cavity can be defined. For instance, a DRIE etching process will generate nearly vertical side walls 3.

Onto the thus prepared handle wafer (see FIG. 39*c*), a second wafer, the device wafer 5 (also referred to as the second semiconductor substrate—see FIG. 39*d*), will be bonded (see FIG. 39*e*). This device wafer 5 will then be subjected e.g. to a conventional CMOS process so to realize electronic components 9 (see FIG. 40) and the wiring 11 as well as connector pads 10. If desired or necessary, the mechanical properties of the membrane 7 which in this embodiment is formed by the region of device wafer 5 covering the cavity 4, can be changed in a well-aimed manner with the aid of trenches 6 and webs 8 (see FIGS. 39f and 40).

After an absolute pressure sensor has been formed in the above described manner by the buried cavity technology (see FIG. 40), there will now be generated, by a further etching step, an opening 98 entering the cavity 4 and serving as a microfluidic feed line making it possible to vent the cavity 4 from the rear side of the sensor (see FIG. 41). Thus, the sensor will work as a differential sensor. In FIG. 41, it can be clearly recognized that the assembly of the bonded handle and device wafers will remain torsionally resistant because the cavity 4 is on all sides delimited by walls, while only the bottom wall is provided with the etched opening 98 which, however, has no influence on the torsional stiffness and the areal moment of inertia of the pressure sensor. For the invention, it is further of essence that the etching process for the opening 98 is the final production step of the pressure sensor according to FIG. 41. This will only be followed, at the most, by assembling and packaging.

FIGS. 42 to 44 illustrate alternative process steps and an alternative design of a pressure sensor, wherein the sole difference from the process and the pressure sensor of FIGS. 39 to 41 resides in that, in FIGS. 42 to 44, the cavity 4 is formed in the device wafer 5.

The invention according to FIGS. 39 to 44 has the following advantages:

1. Use of the buried cavity technology for the manufacture of differential pressure sensors.
2. Especially favorable areal moments of inertia as compared to known differential pressure sensors whose cavity and membrane are etched from the rear. Resultant increase of robustness against housing and assembly stress.
3. Reduced volume to be etched away (i.e. only the volume for the opening 98) and resultant reduction of production costs.
4. Possibility of cubic differential pressure sensors and thus no necessity to bond a glass wafer below the sensor.

Further properties of the invention and of an exemplary application can be described as follows:

1. A photolithographically produced transistor on a doped substrate or in a doped trench, wherein
   i. the transistor is electrically connected only with materials which have a thermal expansion coefficient similar to that of the substrate or the trench in which it is placed,
   ii. the transistor is in no or only a very slight mechanical connection to other materials, particularly materials having mechanical properties different from those of the substrate or the trench—herein, particularly field oxides,
   iii. the transistor comprises symmetries,
   iv. the transistor is produced in different process steps by lithography of different geometric, mutually attuned structures, and
   v. these geometric structures whose superposition and cooperation in the production process will result in the transistor, are selected in such a manner that process variations within the process specification limits which cause changes of the geometries of the individual lithography step results in the form of produced geometric structures, will have no or only a very slight effect on the mechanical properties of the transistors.
2. The transistor according to item 1, which is a MOS transistor.
3. A MOS transistor for detection of mechanical stress, comprising four channel terminals.
4. The MOS transistor according to item 3, which has a four-fold rotational symmetry and a gate plate with exactly this symmetry and channel terminals in an arrangement with exactly this symmetry, without the need of a symmetry of the terminals of this gate plate.
5. The transistor according to item 1, which is a bipolar transistor.
6. The transistor according to any one of items 1 to 4, comprising a channel stopper.
7. The transistor according to any one of items 1 to 4, of which the source and/or drain regions are electrically connected by a highly doped region or a low-impedance polysilicon.
8. The transistor according to any one of items 1 to 7, which is used for detection of mechanical stress.
9. The transistor according to any one of items 1 to 8, which is used in the manner of an electric resistor particularly in a measurement bridge.
10. The transistor according to any one of items 1 to 9, which is a pnp-transistor.
11. The transistor according to any one of items 1 to 9, which is a npn-transistor.
12. The transistor according to any one of items 1 to 9, which is a p-channel transistor.
13. The transistor according to any one of items 1 to 9, which is an n-channel transistor.
14. An electronic circuit comprising transistors according to one or a plurality of items 1 to 13.
15. An electronic circuit being in a functional relationship to a micro-mechanical device according to item 41.
16. The circuit according to item 14 or 15, comprising discrete and/or integrated electronic components.
17. The circuit according to any one of items 14 to 16, which is at least partially produced by monolithic integration.
18. The circuit according to any one of items 14 to 17, comprising at least two geometrically identically designed transistors according to any one of items 1 to 13.
19. The circuit according to item 18, which generates a signal suited for measurement of a different state in at least one physical parameter of the two transistors.
20. The circuit according to item 19, wherein said physical parameter is mechanical stress and/or temperature.
21. The circuit according to any one of items 18 to 20, wherein at least two of the transistors according to any one of items 1 to 13, irrespective of the connecting lines, are arranged symmetrically to each other.
22. The circuit according to any one of items 18 to 20, wherein, for at least two of the transistors according to one or a plurality of items 1 to 13, it is provided that their geometries, irrespective of the connecting lines, can be brought into mutual congruence through rotation by 90°.
23. The circuit according to any one of items 14 to 22, comprising at least four transistors according to any one of items 1 to 13.
24. The circuit according to item 23, wherein said four transistors are connected to form a measurement bridge.
25. The circuit according to item 24, wherein the gate and source of at least one transistor according to any one of items 1 to 13 are short-circuited.
26. The circuit according to item 24 or 25, wherein the gate of at least one transistor according to any one of items 1 to 13 is connected to a reference voltage source.
27. The circuit according to item 26, wherein said reference voltage source is a second, but short-circuited measurement bridge according to any one of items 24 to 27.
28. The circuit according to item 27, wherein said second measurement bridge is similar to the first measurement bridge, particularly regarding the dimensioning of the transistors and/or the circuitry and/or the produced geometries, and/or in the extreme case is a geometric copy of the first measurement bridge.
29. The circuit according to any one of items 14 to 28, wherein respectively two of said four transistors are identically oriented while having the same geometry.
30. The circuit according to item 29, wherein the transistors of one transistor pair are oriented vertically to the transistors of the other transistor pair.
31. The circuit according to item 30, wherein said four transistors are arranged symmetrically in a quadrangle.
32. The circuit according to item 30, wherein said four transistors are arranged symmetrically in a cross configuration.
33. The circuit according to any one of items 14 to 23 or 29 to 32, comprising at least one differential amplifier circuit.
34. The circuit according to item 33, wherein at least one of the transistors of at least one differential amplifier is a transistor according to any one of items 1 to 13.
35. The circuit according to item 33 or 34, comprising at least one reference voltage source which is coupled to at least one first differential amplifier.
36. The circuit according to item 35, wherein said reference voltage source is a second, but short-circuited differential amplifier which is a differential amplifier according to any one of items 33 to 35.
37. The circuit according to item 36, wherein said second differential amplifier is similar to the first differential amplifier, particularly regarding the dimensioning of the transistors and/or the connection of the transistors and/or the produced geometries of the transistors, and/or in the extreme case is a geometric copy of the first differential amplifier.
38. The circuit according to any one of items 14 to 37, wherein at least a part of the circuit is also a part of the micromechanical device.
39. The circuit according to item 38, wherein at least a part of the circuit is functionally connected to at least one micromechanical functional element in such a manner that at least one mechanical parameter of at least one micromechanical functional element is coupled to the state function of the circuit or to at least one electrical parameter of the state function of at least one circuit portion.
40. The circuit according to item 39, wherein said functional element is particularly a bar or web, a membrane, a resonator, a lip clamped on one side, both sides or three sides, a shield or a needle.
41. A micromechanical device which has been produced by lithographic processes and by connecting, particularly bonding, at least two wafers, wherein
  I. prior to the connecting of said at least two wafers, at least one micromechanical functional element in the form of at least one surface structure has been applied on at least one surface of at least one of said two wafers, and
  II. after the connecting of the wafers, at least one of the thus produced micromechanical functional elements and respectively surface structures is situated near the boundary surface between the wafers within the resultant wafer package, and
  III. subsequent to the connecting of the wafers, there has been performed, on at least one surface of the resultant wafer package, at least one process for producing of at least one electronic component, and
  IV. at least one of the thus produced electronic components is sensitive to at least one non-electric physical value and is provided to detect the same, and
  V. said component is produced to be self-adjusting.
42. The micromechanical device according to item 41, wherein at least one of said self-adjusting components is a transistor according to any one of items 1 to 10 or is a part of the circuit according to any one of items 14 to 40.
43. The micromechanical device according to items 41 or 42, which is produced from silicon.
44. The micromechanical device according to any one of items 41 to 43, wherein said at least one micromechanical functional element is at least one cavity.
45. The micromechanical device according to item 44, wherein at least one cavity together with at least one surface of the wafer package defines a membrane.
46. The micromechanical device according to items 44 and 45, wherein at least one cavity comprises no oxides on its walls.
47. The micromechanical device according to any one of items 41 to 46, wherein at least one micromechanical functional element is situated on the surface of the device.
48. The micromechanical device according to item 47, wherein said at least one micromechanical functional element is a web, a trench, a membrane, a perforation and a buried cavity or a blind hole.
49. The micromechanical device according to item 38, wherein at least one micromechanical functional element has been produced on the surface after performing a process, particularly a CMOS process, for producing a transistor according to any one of items 1 to 13 or a circuit according to any one of items 14 to 40.
50. The micromechanical device according to any one of items 41 to 49, wherein at least one micromechanical functional element has been produced inter alia by use of DRIE or plasma etching processes.
51. The micromechanical device according to any one of items 41 to 50, which can be used as a pressure sensor.
52. The micromechanical device according to any one of items 44 to 51, wherein the geometric shape of at least one cavity comprises symmetries with respect to the connection plane of the wafers.
53. The micromechanical device according to any one of items 41 to 52, wherein, on at least one surface of the wafer package, the trenches have been generated by DRIE or plasma etching.
54. The micromechanical device according to item 53, wherein at least one partial quantity of the trenches form a closed structure, e.g. a ring, an ellipse, a quadrangle, a star or the like which only at few sites are interrupted by thin webs 8,20.
55. The micromechanical device according to items 53 and 54, wherein at least a part of the trenches are arranged symmetrically relative to each other.
56. The micromechanical device according to items 52 and 55, wherein the axes of symmetry of a part of the trenches and of at least one cavity coincide and respectively coincide in case of an ideal arrangement.
57. The micromechanical device according to items 52, 55 and 56, wherein at least a part of the trenches are in a mechanical functional relationship with at least one cavity.
58. The micromechanical device according to item 57, wherein the bottom of at least one of the trenches together with at least one of the cavities forms a thinner portion of the membrane or an opening leading into this cavity.
59. The micromechanical device according to any one of items 41 to 58, wherein micromechanical functional elements of the top side, particularly the trenches mentioned under any one of items 47 to 58, are not situated, with their edges defining their shape, above shape-defining edges of micromechanical structures of the bottom side and micromechanical structures of the top side.

60. The micromechanical device according to item 59, wherein the lever length 116 between the starting point of a structure 121 therebelow, particularly of a buried cavity 4, and the starting point of a structure 119 thereabove, particularly of a trench 6, is larger than the smaller one of the vertical lever dimensions 118 and 120 (see FIG. 38).

61. The micromechanical device according to any one of items 44 to 60, wherein, within the body of the micromechanical device, particularly during production of the device within the wafer package, at least one cavity is arranged which is connected with the bottom side or top side of the wafer package by at least one micromechanical functional element, particularly a tube.

62. The micromechanical device according to item 61, which can be used as a pressure differential sensor against a defined referential pressure or ambient pressure.

63. The micromechanical device according to item 61 and 62, comprising at least one microfluidic functional element.

64. The micromechanical device according to item 63, wherein at least one microfluidic functional element serves or can serve for supply of media such as e.g. liquids and gases.

65. A micromechanical device, wherein at least one microfluidic functional element according to any one of items 63 to 64 or a micromechanical functional element according to item 61 has been produced after performing a process, particularly a CMOS process, for producing a transistor according to any one of items 1 to 13 or a circuit according to any one of items 14 to 40.

66. The micromechanical device according to any one of items 1 to 65, wherein, at least as a partial substrate or substrate, a p-doped semiconductor material has been used.

67. The micromechanical device according to any one of items 1 to 65, wherein, at least as a partial substrate or substrate, an n-doped semiconductor material has been used.

68. The micromechanical device according to any one of items 44 to 67, wherein, in at least one substrate, a modification of material, e.g. an $SiO_2$ layer, is provided which serves as an etching stopper for the etching of at least one cavity.

69. The micromechanical device according to any one of items 53 to 68, wherein, in at least one substrate, a modification of material 14 is provided which serves as an etching stopper for the etching of at least a part of the trenches.

70. The micromechanical device according to item 69, wherein, in at least one substrate, at least one modification of material 15 is provided which acts as a membrane in the region of the trenches.

71. The micromechanical device according to item 70, wherein at least one modification of material 15 is made of polysilicon and/or amorphous silicon and has been deposited on one of the wafers of the wafer package prior to the wafer bonding.

72. The micromechanical device according to any one of items 44 to 67 and 69 to 71, wherein at least one cavity has been etched into at least one substrate in a time-controlled manner.

73. The micromechanical device according to any one of items 53 to 68 and 70, wherein at least a part of the trenches have been etched into the substrate in a time-controlled manner.

74. The micromechanical device according to any one of items 53 to 73, wherein, prior to the etching of the trenches, a semiconductor process has been performed for producing electrical functional elements on at least one surface of the wafer package.

75. The micromechanical device according to item 74, comprising at least one electrical functional element which has been produced in the process according to item 74.

76. The micromechanical device according to item 75, wherein at least one electrical functional element has the function of an electrical line or a contact or a through-hole or an electric line insulator or a resistor or a transistor or a diode or a capacitor or a coil.

77. The micromechanical device according to item 76, wherein at least one of the functional elements is operative to change at least one parameter—particularly an electrical parameter—in dependence on mechanical values, particularly tensile stress, compressive stress and shear stress.

78. The micromechanical device according to item 77, wherein said change of parameter can be measured externally of the sensor.

79. The micromechanical device according to item 77 and 54, wherein at least one of the functional elements is in a mechanical functional relationship with at least one web 8,20.

80. The micromechanical device according to item 77 and 36, wherein at least one electronic functional element, relative to
   a) at least one first micromechanical functional element, particularly a membrane (12 or 21),
   b) at least two further, second micromechanical functional elements, particularly trenches (6 or 19), and
   c) at least one third micromechanical functional element, particularly a web (8 or 20),
   said functional elements according to a) to c) being in a mechanical functional relationship,
   is positioned on the third micromechanical functional element, particularly web, in such a manner that said at least one electronic functional element is situated on or near the point of highest mechanical stress when the first micromechanical functional element, particularly a membrane or an inertial mass (12 or 21) is deformed, particularly deflected.

81. The micromechanical device according to item 80, wherein at least one third micromechanical functional element, particularly a web, is shaped in such a manner that said element has a range of high homogenized mechanical stress in case of deformation of the first micromechanical functional element, particularly a membrane or an inertial mass.

82. The micromechanical device according to item 81, wherein at least one electronic functional element is arranged on at least one such site of high homogenized mechanical stress.

83. The micromechanical device according to any one of items 41 to 82, wherein at least two wafers have been formed with different thicknesses.

84. The micromechanical device according to any one of items 41 to 82, wherein a wafer material is a silicon or SOI material.

85. The micromechanical device according to any one of items 44 to 79, wherein the cavity is produced in the lowermost wafer prior to the bonding of three wafers.

86. The micromechanical device according to item 86, wherein said three wafers have been produced with different thicknesses.

87. The micromechanical device according to any one of items 53 to 86, wherein at least one of said second micromechanical functional elements is a trench (6 or 19) having a non-constant width.
88. The micromechanical device according to any one of items 54 to 87, wherein at least one web does not divide a trench (6 or 19) but only extends into it (see e.g. FIG. 25).
89. The micromechanical device according to any one of items 54 to 88, wherein, between the webs and trenches, a surface is formed on a membrane which, being suspended on the webs, is quadratic (see e.g. FIG. 20 or 23), rhombic (see e.g. FIG. 21 or FIG. 22) or round (e.g. FIG. 24).
90. The micromechanical device according to item 89, wherein at least one trench has no bottom and thus is connected to at least one cavity.
91. The micromechanical device according to any one of items 41 to 90, which can be used as a pressure sensor and/or acceleration sensor.
92. The micromechanical device according to any one of items 41 to 91, comprising symmetrically arranged mechanical first functional elements, particularly webs, which are connected to at least one further, second micromechanical functional element, particularly a membrane or inertial mass, and on which respectively mutually similar circuit portions of a circuit according to any one of items 14 to 40 are arranged.
93. The micromechanical device and circuit according to item 92, wherein the circuit portions arranged on the first micromechanical functional elements are electrically connected to each other in such a manner that average values and/or differences will be formed.
94. The micromechanical device according to any one of items 41 to 93, which at least at a first position comprises a first mechanical functional element, particularly a web that is mechanically connected to at least one further, second micromechanical functional element, particularly a membrane, and has a second position being without a mechanical function and being subjected to no or only slight mechanical influence, and wherein, at least at said two positions, respectively mutually similar circuit portions of a circuit according to any one of items 14 to 40 are arranged.
95. The micromechanical device and circuit according to item 94, wherein the circuit portions arranged at said two positions are electrically connected to each other in such a manner that average values and/or differences will be formed.
96. The micromechanical device and circuit according to any one of items 92 to 95, wherein the micromechanical device consists of at least two complete micromechanical partial devices, particularly two pressure sensors according to any one of items 92 to 95 which again are in a functional relationship.
97. The micromechanical device and circuit according to item 96, wherein, within the circuit, mathematical operations, particularly the formation of average values and differences, are performed on electrical output values of said partial devices.
98. The micromechanical device and circuit according to any one of items 94 to 97, wherein at least one second circuit portion being similar to a first circuit portion at said first position, particularly on a web, is used as a reference, particularly voltage reference, and is not in a functional relationship with a micromechanical functional element.
99. The micromechanical device and circuit according to any one of items 92 to 98, wherein, to each circuit portion at a first position, at least one circuit portion similar to the circuit portion on the respective web, is assigned as a reference, and wherein said reference is not in a functional relationship with a micromechanical functional element.
100. The micromechanical device and circuit according to item 99, wherein said reference is situated on the neutral fiber.
101. The micromechanical device and circuit particularly according to any one of items 92 to 100, wherein a part thereof is formed by at least one amplifier circuit.
102. The micromechanical device and circuit particularly according item 101, wherein said amplifier circuit has a positive and a negative input.
103. The micromechanical device and circuit according to any one of items 1 to 101, which in wide regions is provided with a protection against humidity and/or in- and out-diffusion of protons.
104. The micromechanical device and circuit according to item 103, wherein said diffusion protection consists of a silicon-nitride layer.

Further advantages of the invention are:
1. Reduction of the number of required wafer bond connections
2. Reduction of parasitic elements
   a) Elimination of sources of mechanical stress
   b) Protection against dissipation of unavoidable mechanical stress
   c) Maximization, homogenization and linearization of mechanical useful stress fields
   d) Reduction of the dissipation of electronic components
   e) Reduction of the dissipation of electronic circuits
   f) Reduction of the dissipation of micromechanical functional elements
3. Increasing the tolerance of the construction towards mechanical and electrical manufacturing variations
4. Reduction of the effects of unavoidable parasitic elements
5. Reduction of the influence of the design and connection technology
6. Flexibilization of the use of sensors on the side of the user
7. Reduction of the required die area
8. Possibility of coupling to high-volume standard CMOS lines, particularly such lines with p-doped substrates These properties are realized particularly by the measures described hereunder, which can be applied individually or in total or partial combination:
1. Reduction of the number of required wafer bond connections by
   a) Producing cavities prior to the CMOS processing
2. Reduction of parasitic elements by
   a) Elimination of sources of mechanical stress, particularly by
      i) Avoidance of unnecessary layers on the micromechanical functional elements, particularly on pressure sensor membranes
   b) Protection against dissipation of unavoidable mechanical stress, particularly by
      i) Containment of the stress by mechanical guard rings, and
      ii) Reduction of the depth of cavities in the material, wherein the latter has a higher areal moment of inertia
   c) Maximization, homogenization and linearization of useful stress fields, particularly by
      i) Etching trenches into pressure membranes
      ii) Selection of the trench shape
      iii) Distance between rear-side structures and buried structures on the one hand and front-side structures on the other hand for reduction of adjustment errors d) Reduction of the dissipation of electronic components by
   i) Use of self-adjusting structures
e) Reduction of the dissipation of electronic circuits by
   i) Use of a compact, symmetrical, self-adjusting special transistor
   ii) Use of a compact, symmetrical, self-adjusting differential amplifier stage
   iii) Use of a compact, self-adjusting, symmetrical active Wheatstone bridge
f) Reduction of the dissipation of micromechanical functional elements by
   i) Use of defined, CMOS-compatible etching stops
   ii) Use of particularly miniaturized special transistors
3. Increasing the tolerance of the construction towards mechanical and electrical manufacturing variations
   a) Differentiation of the stress direction
   b) Differentiation between stressed and unstressed circuit portions
   c) Differentiation between circuit portions at different symmetry positions
   d) Suitable compensatory connection of circuit portions which can detect the differences i to iii by measuring
   e) Use of particularly miniaturized special transistors
   f) Miniaturization of the mechanical design by well-aimed reduction of the layer stack in the region of micromechanical functional elements
4. Reduction of the effects of unavoidable parasitic elements
   a) Compensatory circuits
   b) Use of particularly miniaturized special transistors
5. Reduction of the influence of the design and connection technology by
   a) Reduction of the depth of cavities in the material, whereby the material has a higher areal moment of inertia
   b) Use of round cavities, whereby the vertical areal moment of inertia is enlarged
6. Flexibilization of the use of sensors on the side of the user by
   a) Adjustability of the amplification by the user
7. Reduction of the required die area
   a) Reduction of the depth of cavities in the material, whereby the material has a higher areal moment of inertia and the sensor can be reduced in size without loss of stability
   b) Use of particularly miniaturized special transistors
   c) Forming a minimal access opening for gases and liquids leading to a buried cavity
8. Possibility of coupling to high-volume standard CMOS lines, particularly such lines with p-doped substrates
   a) Forming the cavities with defined etching stopper prior to the CMOS process
   b) Production of micromechanical functional elements on the surface, such as trenches, after the CMOS processing, by means of plasma or DRIE etching
   c) Forming minimal access openings leading to buried cavities, after the CMOS processing.

LIST OF REFERENCE NUMERALS

1. First wafer
2. Oxide layer
3. Straight wall of cavity 4
4 Cavity 4
5 Second wafer
6 Trenches in the wafer package
7 Thin membrane regions defined by trenches 6 and cavity 4
8 Webs interrupting the trenches 6
8a Bending element
9 Components for detecting the mechanical stress
10 Terminals with terminal lines
11 Surface of the wafer package
12 Central plate of the membrane
13 First wafer
14 $SiO_2$ layer
15 Polysilicon layer
16 Second layer
17 Second oxide layer
18 Cavity
19 Trenches
20 Webs interrupting the trenches
21 Central plate of the membrane
22 Components for detecting the mechanical stress
23 Terminals with terminal lines
24 Surface of the wafer package
25 Membrane of small thickness
26 Negative terminal of the Wheatstone bridge
27 Positive terminal of the Wheatstone bridge
28 First clamp for capturing the voltage on the Wheatstone bridge
29 Lower p-channel MOS diode of the reference voltage source for the Wheatstone bridge
30 Upper p-channel MOS diode of the reference voltage source for the Wheatstone bridge
31 First p-channel MOS transistor of the Wheatstone bridge
32 Second p-channel MOS transistor of the Wheatstone bridge
33 Third p-channel MOS transistor of the Wheatstone bridge
34 Fourth p-channel MOS transistor of the Wheatstone bridge
35 Reference voltage line
36 Second clamp for capturing the voltage on the Wheatstone bridge
37 n+-channel stopper implant
38 Gate-connector transistor 32 and 34 in low-impedance polysilicon
39 Gate-connector transistor 33 and 31 in low-impedance polysilicon
40 n--doped surface (non-conducting)
41 Upper structure sensitive to mechanical stress, e.g. a Wheatstone bridge according to FIG. 12
42 Right-hand structure sensitive to mechanical stress, e.g. a Wheatstone bridge according to FIG. 12
43 Lower structure sensitive to mechanical stress, e.g. a Wheatstone bridge according to FIG. 12
44 First differential amplifier p-channel transistor
45 Second differential amplifier p-channel transistor
46 Third differential amplifier p-channel transistor
47 Fourth differential amplifier p-channel transistor
48 Reference voltage for transistors 44,45,46,47
49 Current-source feed line for transistors 44,45,46,47
50 Common drain contact of the p-channel transistors 44,45, 46,47
51 Connector transistor 46, negative output knot of the differential amplifier
52 Connector transistor 45, positive output knot of the differential amplifier
53 Connector transistor 44, negative output knot of the differential amplifier
54 Connector transistor 47, positive output knot of the differential amplifier
55 Third p-channel transistor for reference bridge circuit
56 Fourth p-channel transistor for reference bridge circuit 57 Upper structure sensitive to mechanical stress, e.g. a Wheatstone bridge according to FIG. 12 as a reference structure for 41 in the region free of mechanical stress
58 Right-hand structure sensitive to mechanical stress, e.g. a Wheatstone bridge according to FIG. 12 as a reference structure for 42 in the region free of mechanical stress
59 Lower structure sensitive to mechanical stress, e.g. a Wheatstone bridge according to FIG. 12 as a reference structure for 43 in the region free of mechanical stress
60 Left-hand structure sensitive to mechanical stress, e.g. a Wheatstone bridge according to FIG. 12 as a reference structure for 44 in the region free of mechanical stress
61 Differential amplifier: current mirror transistor corresponding to transistor 69
62 Differential amplifier: current mirror transistor corresponding to transistor 70
63 Differential amplifier: current mirror transistor corresponding to transistor 71
64 Differential amplifier: current mirror transistor corresponding to transistor 72
65 Reference amplifier: first differential amplifier p-channel transistor
66 Reference amplifier: second differential amplifier p-channel transistor
67 Reference amplifier: third differential amplifier p-channel transistor
68 Reference amplifier: fourth differential amplifier p-channel transistor
69 Reference amplifier: current mirror transistor corresponding to transistor 61
70 Reference amplifier: current mirror transistor corresponding to transistor 62
71 Reference amplifier: current mirror transistor corresponding to transistor 63
72 Reference amplifier: current mirror transistor corresponding to transistor 64
73 Reference amplifier: n-channel current source transistor (current mirror)
74 Reference amplifier: n-channel current source transistor (current mirror)
75 Negative terminal
76 Positive terminal
77 Negative output signal
78 Positive output signal
78a Active region pan
79 p+-contact implant (source region)
79a Metal line
80 p+-contact implant (drain region)
80a Metal line
81 Poly gate of a self-adjusting p-channel transistor
81a Gate oxide
82 n+-implant region (channel stop)
83 n+-implant region (channel stop)
84 Feed line of highly doped polysilicon
85 First p-channel MOS transistor of the Wheatstone bridge
86 Second p-channel MOS transistor of the Wheatstone bridge
87 Third p-channel MOS transistor of the Wheatstone bridge
88 Fourth p-channel MOS transistor of the Wheatstone bridge
89 Left-hand tap
90 Right-hand tap
91 Negative pole
92 Positive pole
93 Second group of trenches for decoupling the membrane from the die body
94 Webs interrupting the group of second trenches 93
95 Third group of trenches for further decoupling the membrane from the die body
96 Webs interrupting the third group of second trenches 95
97 Boss with grid structure (support structure)
98 Bore in the cavity for differential pressure sensors
99 Mechanical guard ring for prevention of dissipation of the mechanical stress introduced by the bond system
100 Left-hand structure sensitive to mechanical stress, e.g. a Wheatstone bridge according to FIG. 12
101 One-transistor element
102 Negative terminal
103 Positive terminal
104 Upper transistor left-hand side (p-channel)
105 Upper transistor right-hand side (p-channel)
106 Lower transistor left-hand side (p-channel)
107 Lower transistor right-hand side (p-channel)
108 Upper reference transistor (p-channel)
109 Lower reference transistor (p-channel)
110 Internal reference voltage
111 First output
112 Second output
113 Parasitic first transistor
114 Parasitic second transistor
115 Entire transistor field plate
116 Lever length (here, the example of the cavity wall 3 to the trench wall)
117 Example: trench wall
118 Height of upper structure (here, by way of example, depth of trench 6)
119 Receptor point of the upper structure (here, by way of example, depth of trench 6)
120 Height of lower structure (here, by way of example, depth of cavity 4)
121 Receptor point of the lower structure (here, by way of example, cavity 4)

The invention claimed is:
1. A method for producing a micro-electromechanical semiconductor component, comprising the following steps:
providing a first semiconductor substrate having an upper face;
providing a second semiconductor substrate having an upper face;
forming a cavity in the upper face of at least one of the first semiconductor substrate and the second semiconductor substrate;
bonding the first semiconductor substrate and the second semiconductor substrate resting on each other by their upper faces;
forming electrical components, electronic components, or both electrical components and electronic components in at least one of the two semiconductor substrates, on at least one of the two semiconductor substrates, or both in at least one of the two semiconductor substrates and on at least one of the two semiconductor substrates prior to etching said opening entering said cavity; and
etching, into one of the first semiconductor substrate and the second semiconductor substrate, an opening entering the cavity;
wherein the electrical components, the electronic components, or both the electrical components and the electronic components are formed after bonding the two semiconductor substrates and prior to etching the opening entering the cavity.
2. The method according to claim 1, further comprising forming a region of the other of the first semiconductor substrate and the second semiconductor substrate opposite to the opening entering the cavity, as a reversibly deformable membrane by generating depressions that locally thin a material thickness of the region.

\* \* \* \* \*